(12) United States Patent
Ko

(10) Patent No.: US 9,077,332 B2
(45) Date of Patent: Jul. 7, 2015

(54) IMPEDANCE CONTROL CIRCUIT AND SEMICONDUCTOR DEVICE INCLUDING THE SAME

(75) Inventor: Hyeong-Jun Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 255 days.

(21) Appl. No.: 13/610,621

(22) Filed: Sep. 11, 2012

(65) Prior Publication Data

US 2013/0113517 A1 May 9, 2013

(30) Foreign Application Priority Data

Nov. 8, 2011 (KR) .......................... 10-2011-0116074

(51) Int. Cl.
*H03K 17/16* (2006.01)
*H03K 19/003* (2006.01)
*H03K 19/00* (2006.01)
*H03K 19/0185* (2006.01)

(52) U.S. Cl.
CPC .... *H03K 19/0005* (2013.01); *H03K 19/018585* (2013.01); *H03K 19/018557* (2013.01)

(58) Field of Classification Search
USPC .......................................................... 326/30
See application file for complete search history.

(56) References Cited

U.S. PATENT DOCUMENTS

| 7,952,382 | B2 | 5/2011 | Moon | |
|---|---|---|---|---|
| 2010/0164540 | A1* | 7/2010 | Kwean | 326/30 |
| 2013/0113515 | A1* | 5/2013 | Lee | 326/30 |

FOREIGN PATENT DOCUMENTS

KR 100980414 9/2010

* cited by examiner

*Primary Examiner* — Jany Richardson
(74) *Attorney, Agent, or Firm* — IP & T Group LLP

(57) ABSTRACT

An impedance control circuit includes a pull-up code generator configured to generate pull-up impedance control codes using a voltage of a first node, a pull-up impedance unit configured to pull-up-drive the first node in response to the pull-up impedance control codes, a plurality of dummy impedance units enabled in response to respective select signals and each configured to pull-up-drive a second node in response to the pull-up impedance control codes, a pull-down code generator configured to generate pull-down impedance control codes using a voltage of the second node, and a plurality of pull-down impedance units enabled in response to the respective select signals and each configured to pull-down-drive the second node in response to the pull-down impedance control codes.

24 Claims, 14 Drawing Sheets

IMPEDANCE CONTROL CIRCUIT AND SEMICONDUCTOR DEVICE INCLUDING THE SAME

CROSS-REFERENCE TO RELATED APPLICATIONS

The present application claims priority of Korean Patent Application No. 10-2011-0116074, filed on Nov. 8, 2011, which is incorporated herein by reference in its entirety.

BACKGROUND

1. Field

Exemplary embodiments of the present invention relate to an impedance control circuit generating an impedance control code for controlling an impedance value.

2. Description of the Related Art

Various types of semiconductor devices are integrated as integrated circuit chips such as CPUs, memories, gate arrays, and the like, in various electrical products such as a personal computer, a server, a workstation, and the like. In most cases, a semiconductor device includes a receiver circuit for receiving various signals transmitted from the outside through an input pad and an output circuit for transmitting signals from the semiconductor device to the outside through an output pad.

Meanwhile, as an operation speed of electrical products is increased, a swing width of signals that are transmitted between the semiconductor devices is reduced. The reason is to minimize a delay time consumed to transfer the signals. However, as the swing width of the signals is reduced, an influence on the signals by external noises is increased and the reflection of the signals increase at interface ends of the semiconductor devices due to impedance mismatching (referred to as mismatch). The impedance mismatching occurs due to a fluctuation in external noises or power supply voltages, a change in operation temperature, a change in manufacturing processes, or the like. When the impedance mismatching occurs, it is difficult to transmit data at a high speed and distorted data may be output from a data output end of the semiconductor device. Therefore, when the other semiconductor device receives the distorted output data as an input data at an input end, a setup/hold fail, a misjudgment of an input level, or the like, may be caused in the input data.

In particular, in order to increase the operation speed of the memory device, impedance matching circuits called on die termination are adopted in the vicinity of pads within an integrated circuit chip. In the on die termination scheme, source termination is performed by an output circuit of a transmitting semiconductor device and parallel termination is performed by a termination circuit connected, in parallel, to a receiver circuit of a receiving semiconductor device that is connected to the input pad thereof.

ZQ calibration means a process of generating an impedance code changing in response to PVT (process, voltage, temperature) conditions. A termination impedance value is controlled using the impedance code generated as the ZQ calibration results. Generally, the pad connected to the external resistor that is a reference of calibration is referred to as a ZQ pad. For this reason, the term ZQ calibration is mainly used.

Hereinafter, an impedance control circuit 10 performing the calibration will be described.

FIG. 1A is a diagram illustrating an impedance control circuit 10 and an impedance control circuit control unit 15 in accordance with the conventional art.

The impedance control circuit control unit 15 controls an operation of the impedance control circuit 10, which will be described with reference to FIG. 1B.

The impedance control circuit 10 in accordance with the conventional art illustrated in FIG. 1A may include a pull-up impedance unit 40, a dummy impedance unit 60, a pull-down impedance unit 90, pull-up and pull-down comparators 20 and 70, and pull-up and pull-down counter units 30 and 80.

When the calibration operation starts, a calibration enable signal CAL_EN is enabled. The pull-up comparator 20 responds to the enabled calibration enable signal CAL_EN to compare reference voltage VREF (for example, VDD/2) with voltage of a first node (ZQ node), which is generated by voltage division of an external resistor $R_{ZQ}$ (for example, 240Ω) connected to the ZQ pad and the pull-up impedance unit 40, and generates a first up/down signal UP/DN1 depending on comparison results.

When the calibration enable signal CAL_EN is enabled, the pull-up counter unit 30 receives the first up/down signal UP/DN1 to generate a pull-up impedance control code PCODE<N:0>. The pull-up impedance control code PCODE<N:0> turns on/off parallel resistors (the impedance value, e.g., the resistance value, of each of the parallel transistors may be designed to correspond to a binary weight) to control the impedance value of the pull-up impedance unit 40. The controlled impedance value of the pull-up impedance unit 40 again affects the voltage of the first node (ZQ node) and the above-mentioned operation is repeated. Consequently, the calibration operation is repeated (pull-up calibration) until the whole impedance value of the pull-up impedance unit 40 is equal to the impedance value of the external resistor $R_{ZQ}$.

The pull-up impedance control code PCODE<N:0> generated by the aforementioned pull-up calibration operation is input to the dummy impedance unit 60 to determine the whole impedance value of the dummy impedance unit 60.

Thereafter the pull-down calibration operation starts to be similar to the case of the pull-up calibration. The calibration is performed (pull-down calibration) so that voltage V2 of a second node is equal to the reference voltage VREF, that is, the whole impedance value of the pull-down impedance unit 90 is equal to the whole impedance value of the dummy impedance unit 60 by using the pull-down comparator 70 performing the comparison operation to generate a second up/down signal (UP/DN2) when the calibration enable signal CAL_EN is enabled and the pull-down counter unit 80 receiving the second up/down signal UP/DN2 to generate a pull down impedance control code NCODE<N:0> when the calibration enable signal CAL_EN is enabled.

FIG. 1B is a diagram illustrating the impedance control circuit control unit 15 in accordance with the conventional art illustrated in FIG. 1A.

The impedance control circuit control unit 15 may include a clock counter unit 15A and a control logic unit 15B. The clock counter unit 15A counts a clock CLK to output a counting code CNT<Y:0>. More specifically, the clock counter unit 15A increases its own value of the counting code CNT<Y:0> whenever the clock CLK is enabled and input from the instant that a calibration command ZQC is enabled and input. The control logic unit 15B operates the impedance control circuit 10 until the value of the counting code CNT<Y:0> reaches a given value depending on a type of calibration operation. For example, the control logic unit 15B operates the impedance control circuit 10 by enabling the calibration enable signal CAL_EN until the counting code CNT<Y:0> is 64 in the case of a short calibration mode. In addition the control logic unit 15B operates the impedance control circuit 10 by enabling the calibration enable signal CAL_EN until the counting code CNT<Y:0> is 512 (or 256) in the case of a long calibration mode.

FIG. 2 is a diagram illustrating a termination circuit in accordance with the conventional art that includes a plurality of pull-up termination units 220A, 220B, . . . , 220C and a plurality of pull-down termination units 270A, 270B, . . . , 270C. The termination circuit means a circuit that receives the impedance control codes PCODE<N:0> and NCODE<N:0> generated in the impedance control circuit 10 illustrated in FIG. 1 to terminate an interface pad. i.e., to determine an impedance value thereof. The impedance value of each pull-up termination units 220A, 220B, . . . , 220C may equal or different to or from the impedance value of each of the pull-down termination units 270A, 270B, . . . , 270C. (Hereinafter, the impedance values of each of all of the termination units 220A, 220B, . . . , 220C, 270A, 270B, . . . , 270C) are described to be 240Ω).

Each of the plurality of pull-up termination units 220A, 220B, . . . , 220C is designed to be similar to the pull-up impedance unit 40. Further, since the impedance values are determined by the same pull-up impedance control code PCODE<N:0>, each of the pull-up termination units 220A, 220B, . . . , 220C and the pull-up impedance unit 40 have the same or similar tendency.

The pull-up driver controller 210 controls each of the pull-up termination units 220A, 220B, . . . , 220C in response to the pull-up impedance control code PCODE<N:0> and the pull-up enable signal PU_EN. The pull-up enable signal PU_EN is a signal that turns on/off each of the pull-up termination units 220A, 220B, . . . , 220C. For example, when the pull-up enable signal PU_EN is enabled, the resistors within the first pull-up termination unit 220A are turned on/off in response to the pull-up impedance control code PCODE<N:0>. Meanwhile, when the pull-up enable signal PU_EN is disabled, the first pull-up termination unit 220A are not operated regardless of the pull-up impedance control code PCODE<N:0>. That is, all of the resistors within the first pull-up termination unit 220A are turned off.

Meanwhile, a pull-up driver controller 210 enables at least one of the plurality of pull-up termination units 220A, 220B, . . . , 220C in response to a mode register set signal MRS<2:0>. For example, when the targeted impedance values of the plurality of pull-up termination units 220A, 220B, . . . , 220C are set to be 120Ω, the pull-up driver controller 210 performs a control to enable only two of the plurality of pull-up termination units 220A, 220B, . . . , 220C in response to the mode register set signal MRS<2:0> and disable the remaining pull-up termination units. When two resistors of 240Ω are connected in parallel, resistance is 120Ω. The resistors within the enabled pull-up termination unit are turned on/off in response to the pull-up impedance control code PCODE<N:0>. All of the resistors within the disabled pull-up termination unit are turned off.

Each of the plurality of pull-down termination units 270A, 270B, . . . , 270C is designed to be similar to the pull-down impedance unit 90. Further, since the impedance values are determined by the same pull-down impedance control code NCODE<N:0>, each of the pull-down termination units 270A, 270B, . . . , 270C and the pull-down impedance unit 90 have the same or similar tendency.

The pull-down driver controller 260 controls each of the pull-down termination units 270A, 270B, . . . , 270C in response to the pull-down impedance control code NCODE<N:0> and the pull-down enable signal PD_EN. The pull-down enable signal PD_EN is a signal that turns on/off each of the pull-down termination units 270A, 270B, . . . , 270C. For example, when the pull-down enable signal PD_EN is enabled, the resistors within the first pull-down termination unit 270A are turned on/off in response to the pull-down impedance control code NCODE<N:0>. When the pull-down enable signal PD_EN is disabled, the first pull-down termination unit 270A are not operated regardless of the pull-down impedance control code NCODE<N:0>. That is, all of the resistors within the first pull-down termination unit 270A are turned off.

Meanwhile, the pull-down driver controller 260 enables at least one of the plurality of pull-down termination units 270A, 270B, . . . , 270C in response to the mode register set signal MRS<2:0>. For example, when the targeted impedance values of the plurality of pull-down termination units 270A, 270B, . . . , 270C are set to be 60Ω, the pull-down driver controller 260 performs a control to enable only four of the plurality of pull-down termination units 270A, 270B, . . . , 270C in response to the mode register set signal MRS<2:0> and disable the remaining pull-down termination units. When four resistors of 240Ω are connected in parallel, resistance is 60Ω. The resistors within the enabled pull-down termination unit are turned on/off in response to the pull-down impedance control code NCODE<N:0>. All of the resistors within the disabled pull-down termination unit are turned off.

When using the plurality of termination units, various impedances may be set, but an error occurs between the targeted impedance value and the actual impedance value due to parasitic resistance occurring in a layout. Generally, when the termination operation is performed, the enabled pull-up termination unit and the enabled pull-down termination unit are set to have the same impedance value. However, as the number of enabled pull-up termination units and the number of enabled pull-down termination units are increased, the error of the impedance value may be increased due to the parasitic resistance. The error is called RTT MISMATCH, which may be obtained by Equation $(2VM/VDD-1)*100$ and has a unit of %. Here, VM means the voltage of the interface node (meaning a node to which the interface pad is connected) of the termination circuit (FIG. 2). The mismatch degree of the impedance value of the enabled termination unit may be determined by using the value of the VM depending on a voltage division rule.

FIGS. 3A and 3B are diagrams illustrating RTT MISMATCH depending on the targeted impedance value in the termination circuit in accordance with the conventional art.

As the number of termination units connected in parallel is increased, the impedance mismatch is also increased due to the parasitic resistance occurring in the layout. FIGS. 3A and 3B illustrate shapes in which the RTT MISMATCH is increased based on the targeted impedance value 120Ω of the termination unit.

FIG. 3A is a diagram illustrating a case in which the RTT MISMATCH has a positive value.

A ratio of the impedance value of the enabled pull-down termination unit to the impedance value of the enabled pull-up termination unit is equal to a ratio of VM to VDD-VM by the voltage division rule. As illustrated in FIG. 3A, the case in which the I'M MISMATCH has a positive value means that the impedance value of the enabled pull-up termination unit is smaller than that of the enabled pull-down termination unit by the aforementioned Equation in the description of FIG. 2.

FIG. 3B is a diagram illustrating a case in which the RTT MISMATCH has a negative value.

A ratio of the impedance value of the enabled pull-down termination unit to the impedance value of the enabled pull-up termination unit is equal to a ratio of VM to VDD-VM by the voltage division rule. As illustrated in FIG. 3B, the case in which the RTT MISMATCH has a negative value means that the impedance value of the enabled pull-up termination unit is larger than that of the enabled pull-down termination unit by the aforementioned Equation in the description of FIG. 2.

The RTT MISMATCH values may be increased to affect the input/output of data under the layout condition.

SUMMARY

An embodiment of the present invention is directed to an impedance control circuit and a semiconductor device including the same capable of reducing an impedance mismatch between a pull-up termination unit and a pull-down termination unit that occurs due to parasitic resistance.

In accordance with an embodiment of the present invention, an impedance control circuit includes: a pull-up code generator configured to generate pull-up impedance control codes using a voltage of a first node; a pull-up impedance unit configured to pull-up-drive the first node in response to the pull-up impedance control codes; a plurality of dummy impedance units enabled in response to respective select signals and each configured to pull-up-drive a second node in response to the pull-up impedance control codes; a pull-down code generator configured to generate pull-down impedance control codes using a voltage of the second node; and a plurality of pull-down impedance units enabled in response to the respective select signals and each configured to pull-down-drive the second node in response to the pull-down impedance control codes.

In accordance with another embodiment of the present invention, an impedance control circuit includes: a pull-down code generator configured to generate pull-down impedance control codes using a voltage of a first node; a pull-down impedance unit configured to pull-down-drive the first node in response to the pull-down impedance control codes; a plurality of dummy impedance units enabled in response to respective select signals and each configured to pull-down-drive a second node in response to the pull-down impedance control codes; a pull-up code generator configured to generate pull-up impedance control codes using a voltage of the second node; and a plurality of pull-up impedance units enabled in response to the respective select signals and each configured to pull-up-drive the second node in response to the pull-up impedance control codes.

In accordance with another embodiment of the present invention, a semiconductor device includes: an impedance control circuit configured to generate pull-up impedance codes and pull-down impedance codes using a voltage of a first node; and a termination circuit configured to control impedance values of an interface pad in response to the pull-up impedance codes and the pull-down impedance codes.

DETAILED DESCRIPTION

Hereinafter, exemplary embodiments of the present invention will be described with reference to the accompanying drawings so that those of ordinary skill in the art to which the present invention pertains may make and use the present invention according to the embodiments of the present invention.

Figure 1A:
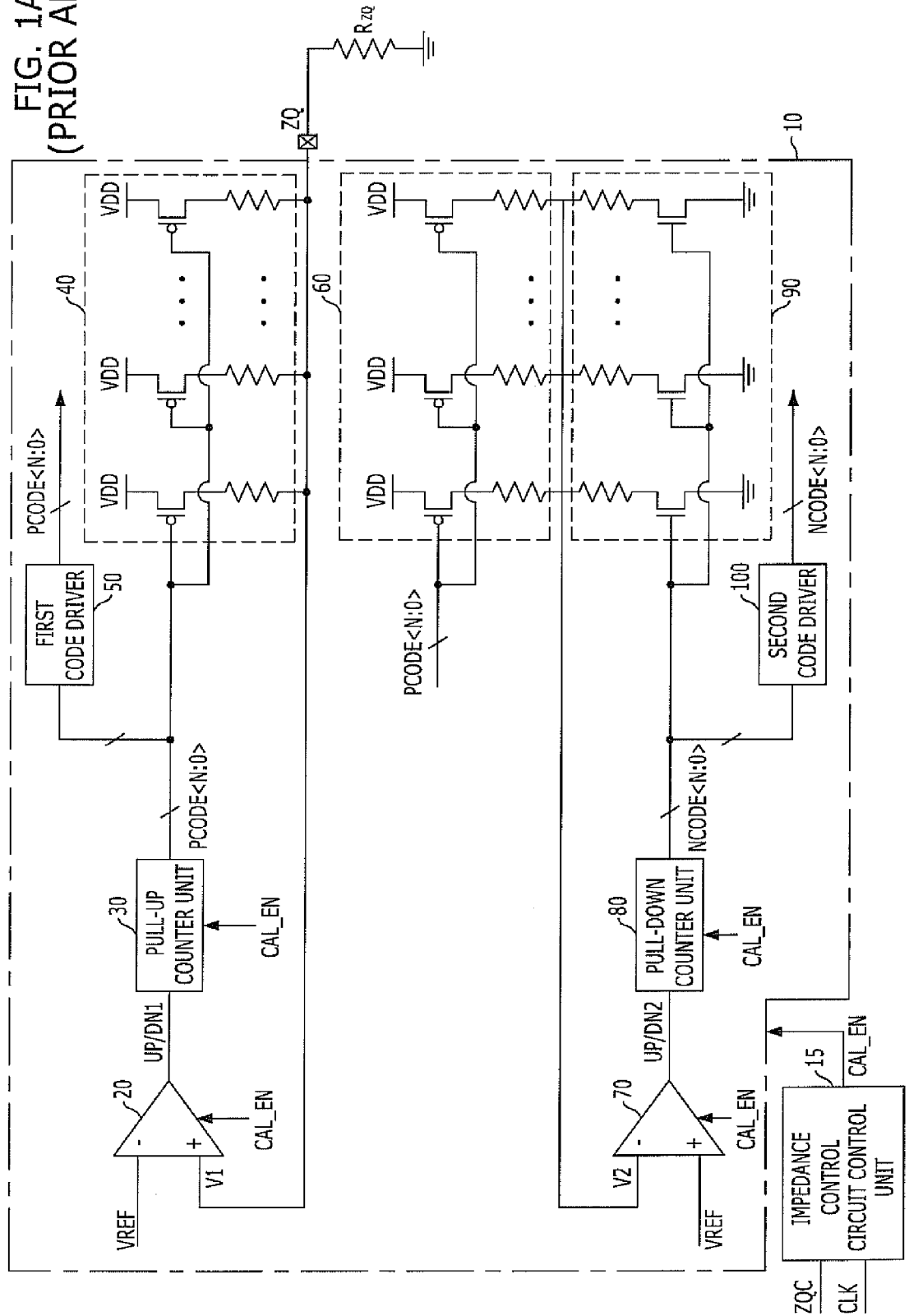
FIG. 1A is a diagram illustrating an impedance control circuit 10 and an impedance control circuit control unit 15 in accordance with the conventional art.
Figure 1B:
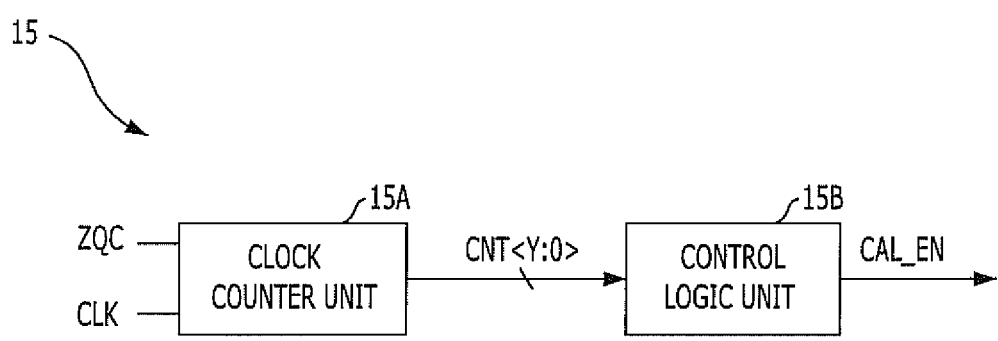
FIG. 1B is a diagram illustrating the impedance control circuit control unit 15 in illustrated in FIG. 1A.
Figure 2:
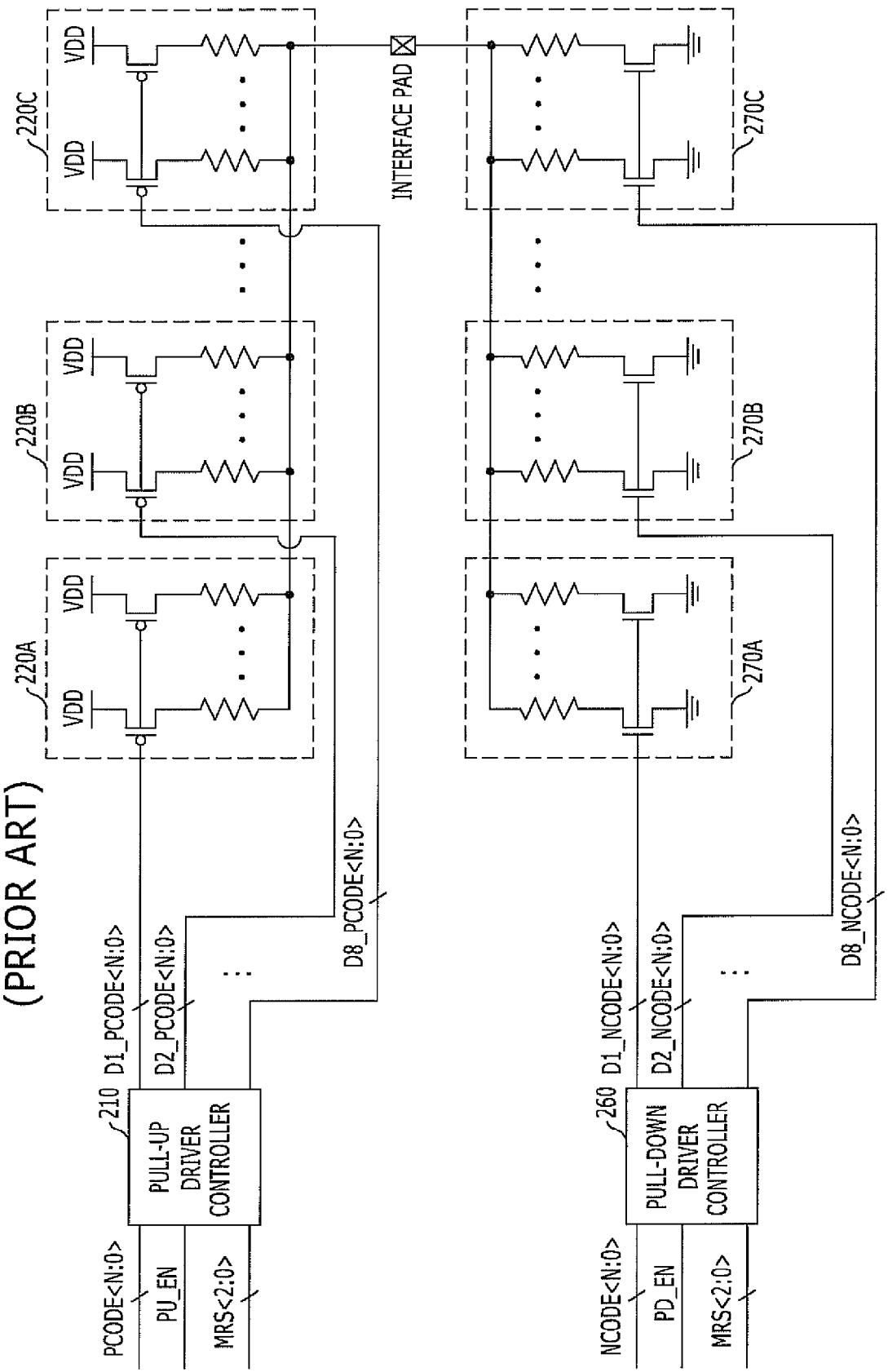
FIG. 2 is a diagram illustrating a termination circuit in accordance with the conventional art.
Figure 3A:
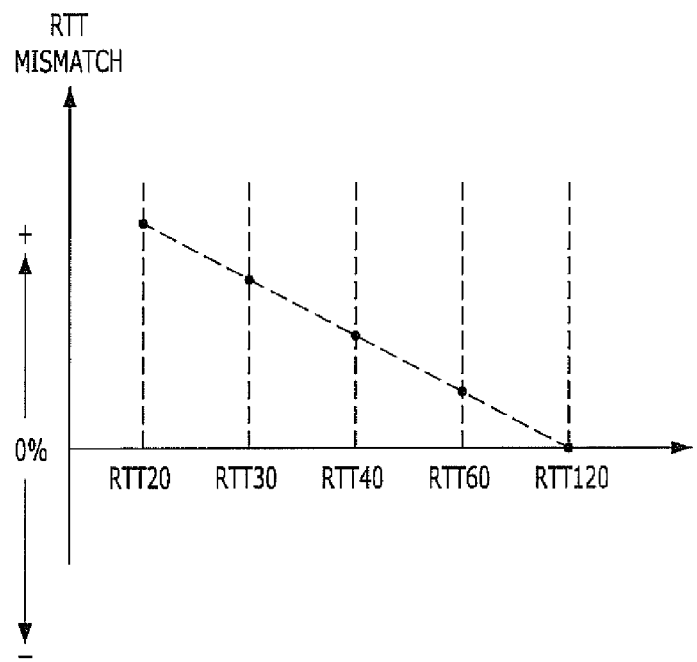
FIGS. 3A and 3B are diagrams illustrating RTT MISMATCH depending on the targeted impedance value in the termination circuit in accordance with the conventional art.
Figure 3B:
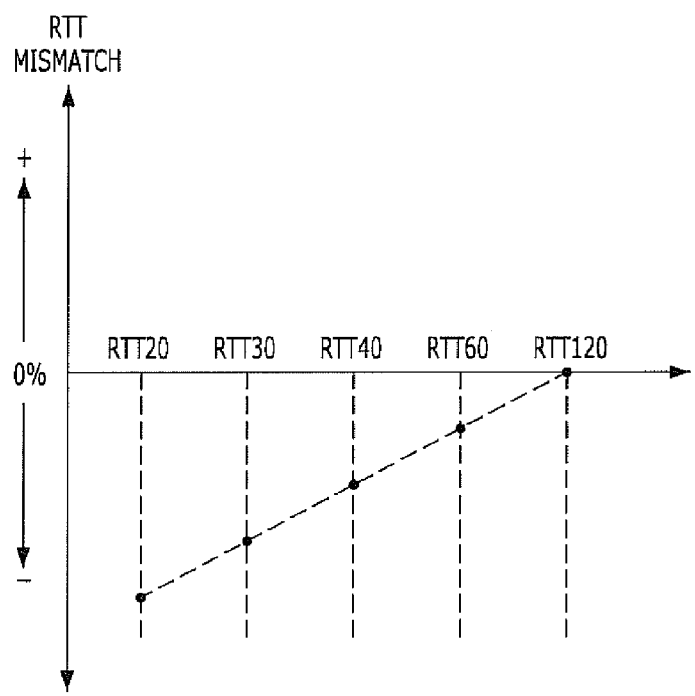
Figure 4:
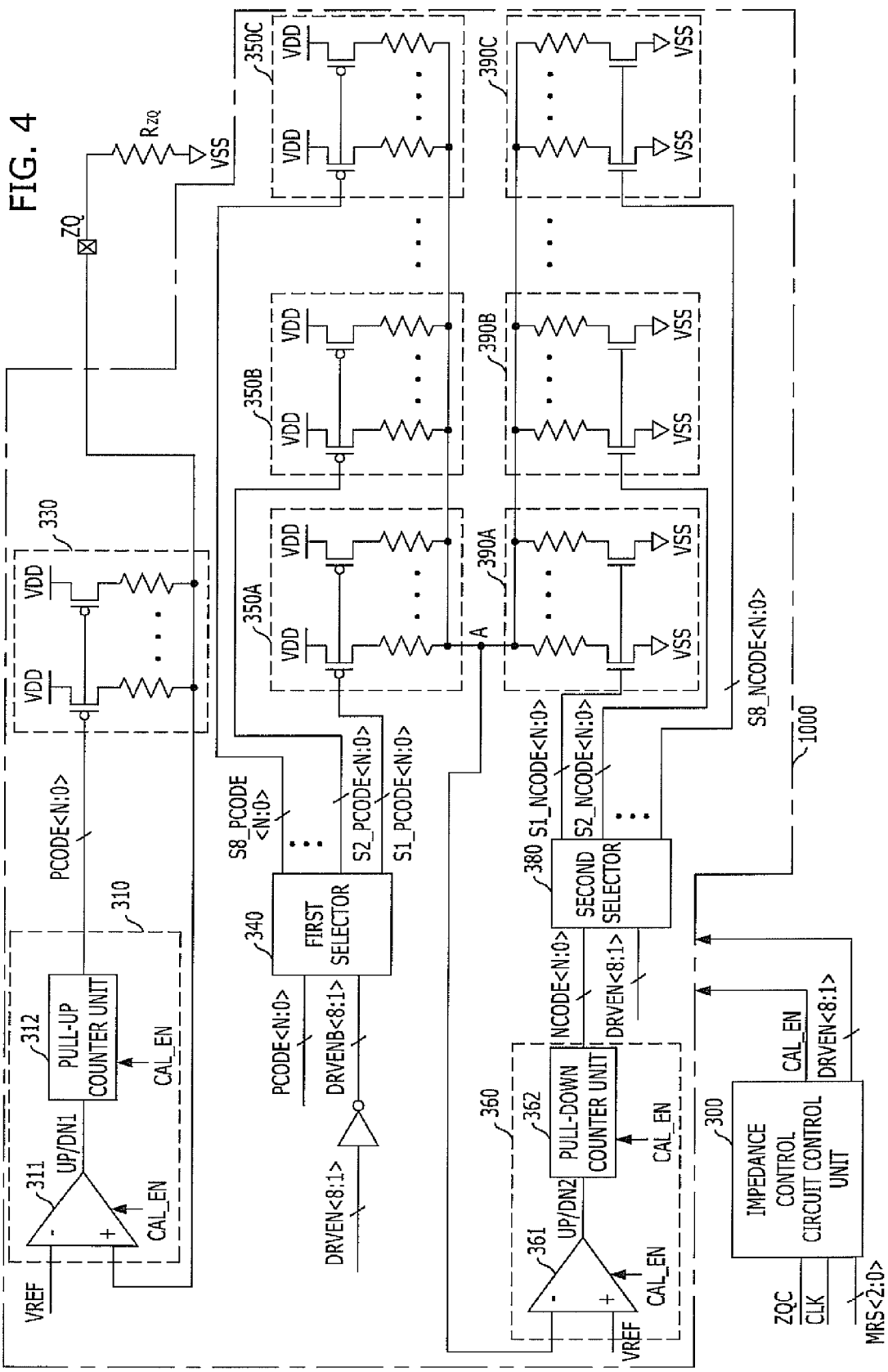
FIG. 4 is a diagram illustrating an impedance control circuit 1000 and an impedance control circuit control unit 300 in accordance with a first embodiment of the present invention.

FIG. 4 is a diagram illustrating an impedance control circuit 1000 and an impedance control circuit control unit 300 in accordance with a first embodiment of the present invention.

The impedance control circuit control unit 300 increases a value of a counting code CNT<Y:0> whenever a clock CLK is enabled and input from an instant that a calibration command ZQC is enabled and input and enables a calibration enable signal CAL_EN until the increased counting code CNT<Y:0> reaches a threshold value to be outputted to an impedance control circuit 1000. In this case, the threshold value is changed depending on a type of a calibration operation. For example, the threshold value may be 64 in the case of a short calibration mode and may be 256 or 512 in the case of a long calibration mode.

Meanwhile, the impedance control circuit control unit 300 decodes an output control signal MRS<2:0> to generate M select signals DRVEN<M:1> and outputs the generated M select signals to the impedance control circuit 1000. At least one of the generated M select signals is enabled and outputted. Here, the output control signal may be a mode register set (MRS) signal. Hereinafter, for description purposes, the case in which the impedance control circuit control unit 300 generates 8 select signals DRVEN<8:1> will be described by way of example. For example, the impedance control circuit control unit 300 may be designed to enables a first select signal DRVEN<1> of the generated 8 select signals when the mode register set signal MRS<2:0> is 000, enable first and second select signals DRVEN<1:2> of the 8 select signals DRVEN<8:1> when the mode register set signal MRS<2:0> is 001, and enable all of the 8 select signals when the mode register set signal MRS<2:0> is 111.

The impedance control circuit 1000 may include a pull-up code generator 310, a pull-up impedance unit 330, M (M is a natural number) dummy impedance units 350A, 350B, . . . , 350C, a pull-down code generator 360, and M pull-down impedance units 390A, 390B, . . . , 390C. Hereinafter, for description purposes, the case in which the impedance control circuit 1000 includes 8 dummy impedance units 350A, 350B, . . . , 350C and 8 pull-down impedance units 390A, 390B, . . . , 390C will be described by way of example.

The pull-up code generator 310 generates a pull-up impedance control code PCODE<N:0> by using voltage of a first node (ZQ node) to which the external resistance $R_{ZQ}$ is connected. More specifically, the pull-up code generator 310 may include a pull-up comparator 311 and a pull-up counter unit 312. The pull-up comparator 311 is enabled in response to the calibration enable signal CAL_EN. The enabled pull-up comparator 311 compares reference voltage VREF with the voltage of the first node (ZQ node) to generate a first up/down signal UP/DN1 representing which voltage is higher.

The pull-up counter unit 312 is enabled in response to the calibration enable signal CAL_EN. The enabled pull-up counter unit 312 increases/reduces the value of the pull-up impedance control code PCODE<N:0> in response to the first up/down signal UP/DN1.

The pull-up impedance unit 330 has the impedance values determined by the pull-up impedance control code PCODE<N:0> and pull-up-drives the first node (ZQ node). More specifically, the pull-up impedance unit 330 may include the plurality of resistors that each are connected to the first node (ZQ node) in parallel and turned on/off in response to each of the pull-up impedance control codes PCODE<N:0>. That is, the resistors supply power supply voltage VDD to the first node therethrough in response to the pull-up impedance control codes PCODE<N:0>.

Each of the 8 dummy impedance units 350A, 350B, . . . , 350C has the impedance values determined by the pull-up impedance control code PCODE<N:0>, is enabled/disabled in response to each of the 8 select signals DRVEN<1:8>, and pull-up-drives a second node A Here, the 8 select signals DRVEN<8:1> are generated by the aforementioned impedance control circuit control unit 300 and at least one select signal of the 8 select signals DRVEN<8:1> is enabled.

The first dummy impedance unit 350A is enabled when a first select signal DRVEN<1> is enabled in a high level, that is, a first inverting select signal DRVENB<1> is enabled in a low level and the enabled first dummy impedance unit 350A determines the impedance value by the input pull-up impedance control code PCODE<N:0>. Meanwhile, when the first inverting select signal DRVENB<1> is disabled in a high level, the first dummy impedance unit 350A is disabled. That is, when the first inverting select signal DRVENB<1> is enabled in a low level, a plurality of resistors within the first dummy impedance unit 350A are turned on/off in response to the pull-up impedance control code PCODE<N:0> and when the first inverting select signal DRVENB<1> is disabled in a high level, all of the plurality of resistors in the first dummy impedance unit 350A are turned off.

The second dummy impedance unit 350B is enabled when a second select signal DRVEN<2> is enabled in a high level, that is, a second inverting select signal DRVENB<2> is enabled in a low level and the enabled second dummy impedance unit 350B determines the impedance value by the input pull-up impedance control code PCODE<N:0>. Meanwhile, when the second inverting select signal DRVENB<2> is disabled in a high level, the second dummy impedance unit 350B is disabled. That is, when the second inverting select signal DRVENB<2> is enabled in a low level, a plurality of resistors within the second dummy impedance unit 350B is turned on/off in response to the pull-up impedance control code PCODE<N:0> and when the second inverting select signal DRVENB<2> is disabled in a high level, all of the plurality of resistors in the second dummy impedance unit 350B are turned off.

Further, similar to the first dummy impedance unit 350A or the second dummy impedance unit 350B, the third to eighth dummy impedance units 350C are enabled when inverting select signals DRVENB<3> to DRVENB<8> thereof are enabled in a low level and disabled when inverting select signals DRVENB<3> to DRVENB<8> are disabled in a high level.

The first to eight dummy impedance units 350A, 350B, . . . , 350C may be equally configured except for only the select signal DRVEN<8:1> corresponding thereto. In this case, the impedance values of the enabled dummy impedance units may be equally determined by the pull-up impedance control code PCODE<N:0>.

Meanwhile, the configuration in which the corresponding dummy impedance unit is enabled/disabled in response to the enabled/disabled inverting select signal DRVENB<k> (1≤K≤M) may be implemented in various forms. FIG. 4 illustrates the case in which the aforementioned operation is performed through the first selector 340. That is, when the pull-up impedance control code PCODE<N:0> and the 8 inverting select signals DRVENB<8:1> are input to the first selector 340, the pull-up impedance control codes S1_PCODE<N:0>, S2_PCODE<N:0>, . . . , S8_PCODE<N:0> to be transferred to the respective dummy impedance units 350A, 350B, . . . , 350C are determined. For example, when only the first inverting select signal DRVENB<1> and the second inverting select signal DRVENB<2> are enabled in a low level and the remaining inverting select signals DRVENB<8:3> are disabled in a high level to be input to the first selector 340, the first selector 340 transfers the first pull-up impedance control code S1_PCODE<N:0> and the second pull-up impedance control code S2_PCODE<N:0> having the same value as the input pull-up impedance control code PCODE<N:0>, respectively, to the first and second dummy impedance units 350A and 350B. The first selector 340 transfers the third to eight pull-up impedance control codes S3_PCODE<N:0> to S8_PCODE<N:0> each configured by N+1 bits having a high level to the third to eight dummy impedance units 350C, respectively. The first selector 340 will be described in detail with reference to FIG. 5A.

The pull-down code generator 360 generates the pull-down impedance control code NCODE<N:0> using the voltage of the second node (node A). More specifically, the pull-down code generator 360 may include a pull-down comparator 361 and a pull-down counter unit 362. The pull-down code generator 360 is enabled in response to the calibration enable signal CAL_EN. The enabled pull-down comparator 361 compares reference voltage VREF with the voltage of the second node (node A) to generate a second up/down signal UP/DN2 representing which voltage is higher. The pull-down counter unit 380 is enabled in response to the calibration enable signal CAL_EN. The enabled pull-down counter unit 380 increases/reduces the value of the pull-down impedance control code NCODE<N:0> in response to the second up/down signal UP/DN2.

Each of the 8 pull-down impedance units 390A, 390B, . . . , 390C has the impedance values determined by the pull-down impedance control code NCODE<N:0>, is enabled/disabled in response to each of the first to eighth select signals DRVEN<1:8>, and pull-down-drives the second node (node A).

The first pull-down impedance unit 390A is enabled when the first select signal DRVEN<1> is enabled in a high level and the enabled first pull-down impedance unit 390A determines the impedance value by the input pull-down impedance control code NCODE<N:0>. Meanwhile, when the first select signal DRVEN<1> is disabled in a low level, the first pull-down impedance unit 390A is disabled. That is, when the first select signal DRVEN<1> is enabled in a high level, a plurality of resistors in the first pull-down impedance unit 390A are turned on/off in response to the pull-down impedance control code NCODE<N:0> and when the first select signal DRVEN<1> is disabled in a low level, all of the plurality of resistors in the first pull-down impedance unit 390A are turned off.

Further, similar to the first pull-down impedance unit 390A, the second to eight pull-down impedance units 390B, . . . , 390C are each enabled when the select signals DRVEN<2> to DRVEN<8> thereof are enabled in a high level and are each disabled when the select signals DRVEN<2> to DRVEN<8> are disabled in a low level.

The first to eight pull-down impedance units 390A, 390B, . . . , 390C may be equally configured except for only the select signal DRVEN<8:1> corresponding thereto. In this case, the impedance values of the enabled pull-down impedance units may be equally determined by the pull-down impedance control code NCODE<N:0>.

Meanwhile, the configuration in which the corresponding pull-down impedance unit is enabled/disabled in response to the enabled/disabled select signal DRVEN<k> (1≤K≤M) may be implemented in various forms. As the embodiment, FIG. 4 illustrates the case in which the aforementioned operation is performed through the second selector 380. That is, when the pull-down impedance control code NCODE<N:0> and the 8 select signals DRVEN<8:1> are input to the second selector 380, the pull-down impedance control codes S1_NCODE<N:0>, S2_NCODE<N:0>, . . . , S8_NCODE<N:0> to be transferred to the respective pull-down impedance units 390A, 390B, . . . , 390C are determined. For example, when only the first select signal DRVEN<1> and the second select signal DRVEN<2> are enabled in a high level and the remaining select signals DRVEN<8:3> are disabled in a low level to be input to the second selector 380, the second selector 380 transfers each of the first pull-down impedance control code S1_NCODE<N:0> and the second pull-down impedance control code S2_NCODE<N:0> having the same value as the input pull-down impedance control code NCODE<N:0> to each of the first and second pull-down impedance units 390A and 390B. Further, the second selector 380 transfers the third to eight pull-down impedance control codes S3_NCODE<N:0> to S8_NCODE<N:0> each configured by N+1 bits of a low level to the third to eight dummy impedance units 350C, respectively. The second selector 380 will be described in detail with reference to FIG. 5B.

Figure 5A:
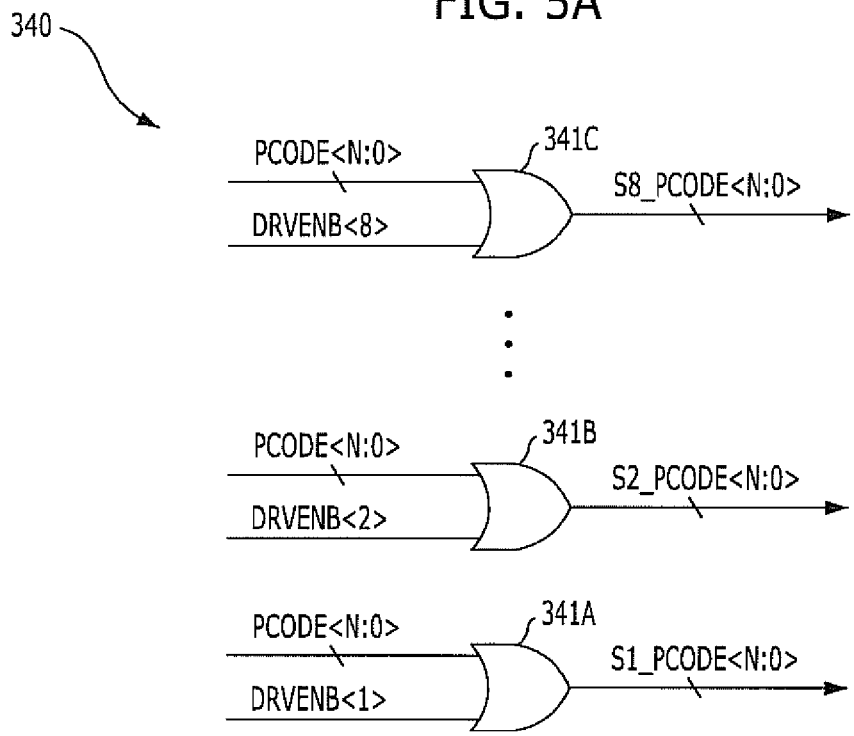
FIG. 5A is a diagram illustrating an embodiment of a first selector 440 illustrated in FIG. 4.

FIG. 5A is a diagram illustrating an embodiment of a first selector 340 illustrated in FIG. 4.

The first selector 340 outputs the pull-up impedance control codes S1_PCODE<N:0>, S2_PCODE<N:0>, . . . , S8_PCODE<N:0> configured by N+1 bits having a high level regardless of the input pull-up impedance control code PCODE<N:0> when the inverting select signal DRVENB<8:1> is in a high level. Meanwhile, the first selector 340 outputs the input pull-up impedance control code PCODE<N:0> as the pull-up impedance control codes S1_PCODE<N:0>, S2_PCODE<N:0>, S8_PCODE<N:0> when the inverting select signal DRVENB<8:1> is in a low level. For example, when the first inverting select signal DRVENB<1> is in a high level, a first OR gate 341A outputs the pull-up impedance control code S1_PCODE<N:0> configured by N+1 bits having a high level regardless of the input pull-up impedance control code PCODE<N:0>. In this case, all of the plurality of resistors configuring the first dummy impedance unit 350A are turned-off. Meanwhile, the first OR gate 341A outputs the input pull-up impedance control code PCODE<N:0> as the pull-up impedance control code S1_PCODE<N:0> when the first inverting select signal DRVENB<1> is in a low level. In this case, the plurality of resistors configuring the first dummy impedance unit 350A are turned on/off in response to each bit of the pull-up impedance control code S1_PCODE<N:0>. Similarly, when the second inverting select signal DRVENB<2> is in a high level, the second OR gate 341B outputs the pull-up impedance control code S2_PCODE<N:0> configured by N+1 bits having a high level regardless of the input pull-up impedance control code PCODE<N:0>. In this case, all of the plurality of resistors configuring the second dummy impedance unit 350B are turned-off. Meanwhile, the second OR gate 341B outputs the input pull-up impedance control code PCODE<N:0> as the pull-up impedance control code S2_PCODE<N:0> when the second inverting select signal DRVENB<2> is in a low level. In this case, the plurality of resistors configuring the second dummy impedance unit 350B are turned on/off in response to each bit of the pull-up impedance control code S2_PCODE<N:0>.

Figure 5B:
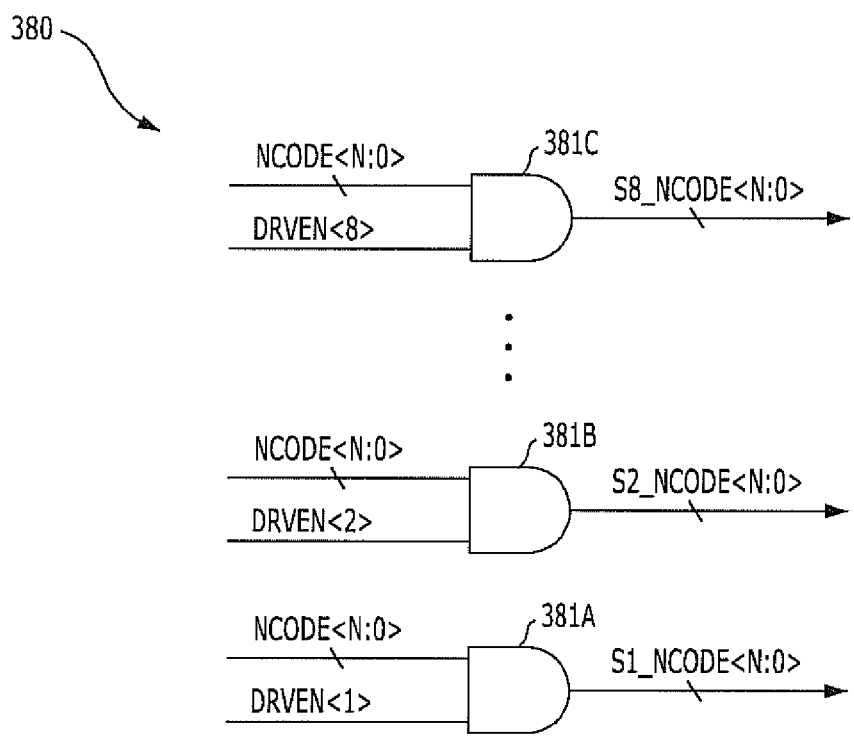
FIG. 5B is a diagram illustrating an embodiment of a second selector 640 illustrated in FIG. 4.

FIG. 5B is a diagram illustrating an embodiment of a second selector 380 illustrated in FIG. 4.

The second selector 380 outputs the pull-down impedance control codes S1_NCODE<N:0>, S2_NCODE<N:0>, . . . , S8_NCODE<N:0> configured by N+1 bits having a low level regardless of the input pull-down impedance control code NCODE<N:0> when the select signal DRVEN<8:1> is in a low level. Meanwhile, the second selector 380 outputs the input pull-down impedance control code NCODE<N:0> as the pull-down impedance control codes S1_NCODE<N:0>, S2_NCODE<N:0>, . . . , S8_NCODE<N:0> when the select signal DRVEN<8:1> is in a high level. For example, when the first select signal DRVEN<1> is in a low level, a first AND gate 381A outputs the pull-down impedance control code S1_NCODE<N:0> configured by N+1 bits having a low level regardless of the input pull-down impedance control code NCODE<N:0>. In this case, all of the plurality of resistors configuring the first pull-down impedance unit 390A are turned-off. Meanwhile, the first AND gate 381A outputs the input pull-down impedance control code NCODE<N:0> as the pull-down impedance control code S1_NCODE<N:0> when the first select signal DRVEN<1> is in a high level. In this case, the plurality of resistors configuring the first pull-down impedance unit 390A are turned on/off in response to each bit of the pull-down impedance control code S1_NCODE<N:0>. Similarly, when the second select signal DRVEN<2> is in a low level, the second AND gate 381B outputs the pull-down impedance control code S2_NCODE<N:0> configured by N+1 bits having a low level regardless of the input pull-down impedance control code NCODE<N:0>. In this case, all of the plurality of resistors configuring the second pull-down impedance unit 390B are turned-off. Further, the second AND gate 381B outputs the input pull-down impedance control code NCODE<N:0> as the pull-down impedance control code S2_NCODE<N:0> when the second select signal DRVEN<2> is in a high level. In this case, the plurality of resistors configuring the second pull-down impedance unit 390B are turned on/off in response to each bit of the pull-down impedance control code S2_NCODE<N:0>.

The overall operation of the impedance control circuit 1000 illustrated in FIG. 4 will be described.

When the calibration operation starts, the calibration enable signal CAL_EN is enabled. The pull-up comparator 311 compares the voltage of the first node (ZQ node) (the voltage generated by the voltage division of the external resistor $R_{ZQ}$ connected to the ZQ pad and the pull-up impedance unit 330) with the reference voltage VREF in response to the calibration enable signal CAL_EN to generate the first up/down signal UP/DN1. When the calibration enable signal CAL_EN is enabled, the pull-up counter unit 312 receives the first up/down signal UP/DN1 to generate the pull-up impedance control code PCODE<N:0>. The pull-up impedance control code PCODE<N:0> turns-on/off the parallel resistors in the pull-up impedance unit 330 to control the impedance value of the pull-up impedance unit 330. The controlled impedance value of the pull-up impedance unit 330 again affects the voltage of the first node (ZQ node) and the abovementioned operation is repeated. Consequently, the calibration operation is repeated (pull-up calibration) until the whole impedance value of the pull-up impedance unit 330 equal to the impedance value of the external resistor $R_{ZQ}$.

The pull-up impedance control code PCODE<N:0> generated by the aforementioned pull-up calibration operation is input to the first to eighth dummy impedance units 350A, 350B, ..., 350C together with the first to eight inverting select signals DRVENB<8:1>. In this case, the first to eighth select signals DRVEN<8:1> are transferred from the impedance control circuit control unit 300 and the impedance control circuit control unit 300 enables at least one of the 8 select signals DRVEN<8:1> in response to the output control signal MRS<2:0>. Hereinafter, for description purposes, the case in which the output control signal MRS<2:0> is 001 and the first and second select signals DRVEN<1:2> of the 8 select signals DRVEN<8:1> are enabled in a high level in response to the output control signal MRS<2:0> (first and second inverting select signals DRVENB<1:21> are enabled in a low level) will be described by way of example. In detail, when the pull-up impedance control code PCODE<N:0> and the 8 inverting select signal DRVENB<8:1> are input to the first selector 340, the first selector 340 transfers each of the first and second pull-up impedance control codes S1_PCODE_N:0> and S2_PCODE<N:0> having the same value as the pull-up impedance control code PCODE<N:0> to each of the first and second dummy impedance units 350A and 350B corresponding to the first and second inverting select signals DRVENB<1:2> enabled in a low level of the 8 inverting select signals DRVENB<8:1>. The first selector 340 transfers the pull-up impedance control codes S3_PCODE<N:0> to S8_PCODE<N:0> configured by N+1 bits having a high level to the respective third to eight dummy impedance units 350C corresponding to the third to eight inverting select signals DRVENB<3> to DRVENB<8> disabled in a high level. That is, the third to eighth dummy impedance units 350C are disabled and only the first and second dummy impedance units 350A and 350B are enabled. The impedance values of the first and second dummy impedance units 350A and 350B are determined by the pull-up impedance control code PCODE<N:0> and thus, a sum of the impedance values of the first and second dummy impedance units 350A and 350B becomes the whole impedance value of the 8 dummy impedance units 350A, 350B, ..., 350C.

Now, the pull-down calibration operation starts. The calibration is performed (pull-down calibration) so that the voltage of the second node (node A) is equal to the reference voltage VREF, that is, the whole impedance value of the 8 pull-down impedance unit 390A, 390B, ..., 390C is equal to the whole impedance value of 8 dummy impedance units 350A, 350B, ..., 350C by using the pull-down comparator 361 performing the comparison operation to generate a second up/down signal (UP/DN2) and the pull-down counter unit 362 receiving the second up/down signal UP/DN2 to generate the pull down impedance control code NCODE<N:0>, when the calibration enable signal CAL_EN is enabled. More specifically, since the first and second select signals DRVEN<1:2> are enabled in a high level, the pull-down impedance control code NCODE<N:0> generated in the fulldown counter unit 362 is input to each of the first and second pull-down impedance units 390A and 390B and since the remaining third to eighth select signals DRVEN<3:8> are disabled in a low level, the third to eighth impedance control codes S3_NCODE<N:0> to S8_NCODE<N 0> configured by N+1 bits having a low level are input to the third to eighth pull-down impedance units 390C, respectively. That is, the third to eighth pull-down impedance units 390C are disabled and only the first and second pull-down impedance units 390A and 390B are enabled. The impedance values of the enabled first and second pull-down impedance units 390A and 390B are determined by the pull-down impedance control code NCODE<N:0>. Therefore, the sum of the impedance values of the first and second pull-down impedance units 390A and 390B connected in parallel becomes the impedance value of the 8 pull-down impedance units 390A, 390B, ..., 390C. As a result, the pull-down calibration is performed so that the whole impedance value of the 8 pull-down impedance units 390A, 390B, ..., 390C is equal to the whole impedance value of the 8 dummy impedance units 350A, 350B, ..., 350C.

Figure 6:
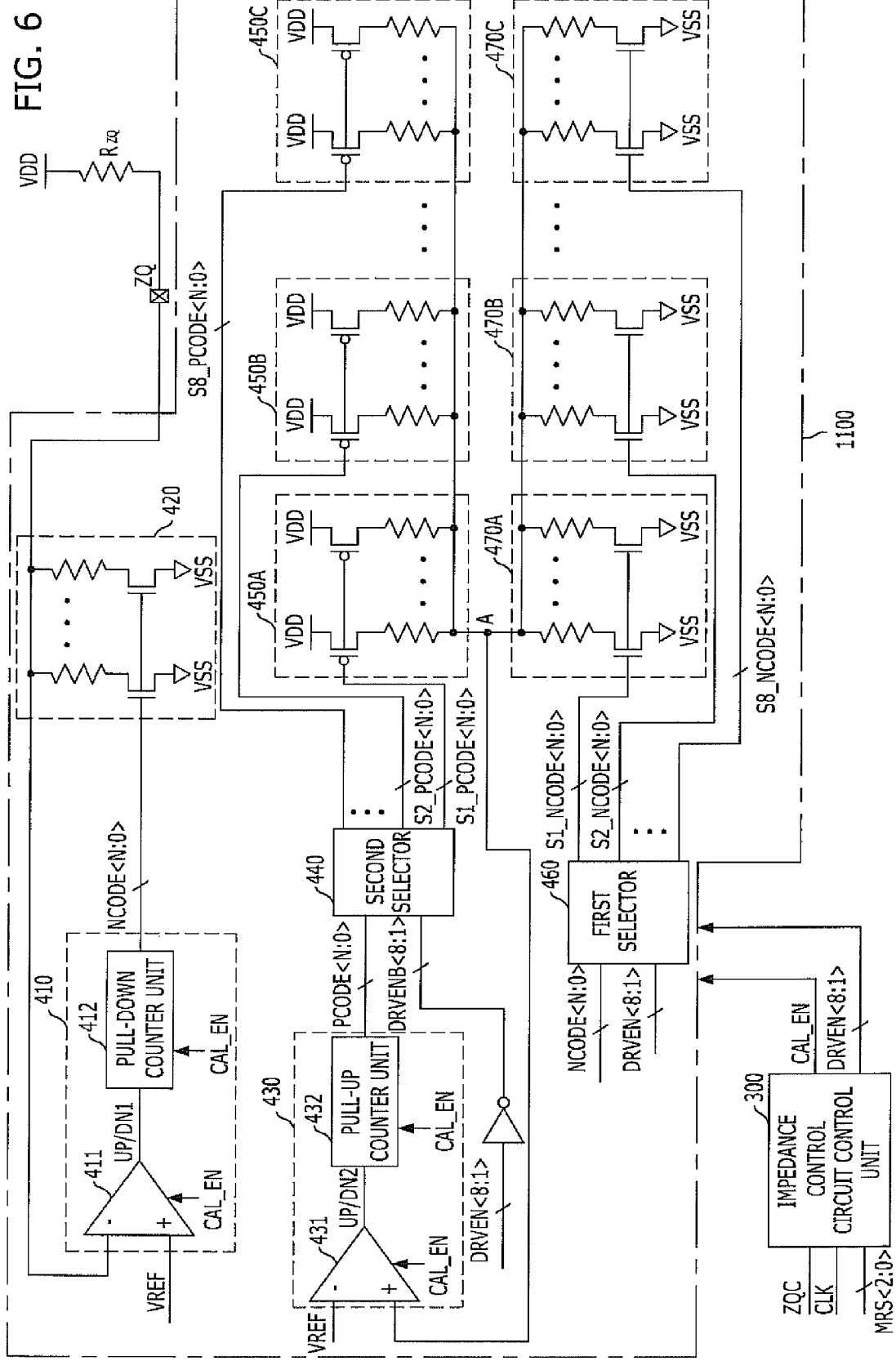
FIG. 6 is a diagram illustrating the impedance control circuit 1000 and the impedance control circuit control unit 300 in accordance with a second embodiment of the present invention.

FIG. 6 is a diagram illustrating the impedance control circuit 1100 and the impedance control circuit control unit 300 in accordance with a second embodiment of the present invention.

As illustrated in FIG. 6, the configuration and principle of the impedance control circuit control unit 300 are the same as the impedance control circuit control unit 300 illustrated in FIG. 4.

The impedance control circuit 1100 may include a pull-down code generator 410, a pull-down impedance unit 420, M dummy impedance units 470A, 470B, ..., 470C, a pull-up code generator 430, and M pull-up impedance units 450A, 450B, ..., 450C. The impedance control circuit 1100 illustrated in FIG. 6 is a different from the impedance control circuit 1000 illustrated in FIG. 4 in performing the pull-down calibration operation first and then, the pull-up calibration operation. Hereinafter, for description purposes, the case in which the impedance control circuit 1100 includes the 8 dummy impedance units 470A, 470B, ..., 470C and the 8 pull-up impedance units 450A, 450B, ..., 450C is described by way of example and the difference between the impedance control circuit 1100 illustrated in FIG. 6 and the impedance control circuit 1000 illustrated in FIG. 4 will be mainly described.

The pull-down code generator 410 generates the pull-down impedance control code NCODE<N:0> by using the voltage of the first node (ZQ node) to which the external resistance $R_{ZQ}$ is connected. In detail, the pull-down code generator 410 may include a pull-down comparator 411 comparing the reference voltage VREF with the voltage of the first node (ZQ node) when the calibration enable signal CAL_EN is enabled to generate the first up/down signal UP/DN1 representing which voltage is higher and a pull-down counter unit 412 increasing/reducing the value of the pull-down impedance control code NCODE<N:0> in response to the first up/down signal UP/DN1 when the calibration enable signal CAL_EN is enabled.

The pull-down impedance unit 420 has the impedance values determined by the pull-down impedance control code NCODE<N:0> and pull-down-drives the first node (ZQ node). More specifically, the pull-down impedance unit 420 may include the plurality of resistors that each are connected to the first node (ZQ node) in parallel and turned on/off in response to each of the pull-down impedance control codes NCODE<N:0>. That is, the pull-down impedance control code NCODE<N:0> turns-on/off the parallel resistors in the pull-down impedance unit 420 to control the impedance value of the pull-down impedance unit 420.

The first selector 460 transfers the pull-down impedance control code configured by N+1 bits having a low level to an K-th dummy impedance unit regardless of the input pull-down impedance control code NCODE<N:0> when an K-th select signal DRVEN<K> of the 8 select signals DRVEN<8:1> is in a low level. Meanwhile, the first selector 460 transfers the input pull-down impedance control code NCODE<N:0> to the K-th dummy impedance unit as it is when the K-th select signal DRVEN<K> is in a high level. The first selector 460 may have the same configuration as the second selector 380 illustrated in FIG. 5B.

Each of the 8 dummy impedance units 470A, 470B, . . . , 470C has the impedance values determined by the pull-down impedance control code NCODE<N 0>, is enabled/disabled in response to each of the first to eighth select signals DRVEN<1:8>, and pull-down-drives the second node (node A). Here, the 8 select signals DRVEN<8:1> are generated by the impedance control circuit control unit 300 described above with reference to FIG. 4 and at least one select signal of the 8 select signals DRVEN<8:1> is enabled.

The first dummy impedance unit 470A is enabled when the first select signal DRVEN<1> is enabled in a high level and is disabled when the first select signal DRVEN<1> is disabled. The first dummy impedance unit 470A enabled by the first select signal DRVEN<1> determines the impedance value by the input pull-down impedance control code NCODE<N:0>. That is, when the first select signal DRVEN<1> is enabled in a high level, a plurality of resistors in the first dummy impedance unit 470A are turned on/off in response to the pull-down impedance control code NCODE<N:0> and when the first select signal DRVEN<1> is disabled in a low level, all of the plurality of resistors in the first dummy impedance unit 470A are turned off.

Further, similar to the first dummy impedance unit 470A, the second to eighth dummy impedance units 470B, . . . , 470C are enabled when the respective select signals DRVEN<2> to DRVEN<8> thereof are enabled in a high level and are disabled when the respective select signals DRVEN<2> to DRVEN<8> are disabled in a low level.

The first to eight dummy impedance units 470A, 470B, . . . , 470C may be equally configured except for only the select signal DRVEN<8:1> corresponding thereto. In this case, the impedance values of the enabled dummy impedance units may be equally determined by the pull-down impedance control code NCODE<N:0>.

The pull-up code generator 430 generates the pull-up impedance control code PCODE<N:0> using the voltage of the second node (node A). More specifically, the pull-up code generator 430 may include the pull-up comparator 431 and the pull-up counter unit 432. The pull-up comparator 431 compares the reference voltage VREF with the voltage of the second node (node A) when the calibration enable signal CAL_EN is enabled to generate the second up/down signal UP/DN2 representing which voltage is higher. The pull-up counter unit 432 increases/reduces the value of the pull-up impedance control code PCODE<N:0> in response to the second up/down signal UP/DN2 when the calibration enable signal CAL_EN is enabled.

The second selector 440 transfers the pull-up impedance control code configured by N+1 bits having a high level to the K-th pull-up impedance unit regardless of the input pull-up impedance control code PCODE<N:0> when an K-th inverting select signal DRVENB<K> of the 8 inverting select signals DRVENB<8:1> is in a high level. Meanwhile, the second selector 440 transfers the input pull-up impedance control code PCODE<N:0> to the K-th pull-up impedance unit as it is when the K-th inverting select signal DRVENB<K> is in a low level. The second selector 440 may have the same configuration as the first selector 340 illustrated in FIG. 5A.

Each of the first to eighth pull-up impedance units 450A, 450B, . . . , 450C has the impedance values determined by the pull-up impedance control code PCODE<N:0>, is enabled/disabled in response to each of the first to eighth select signals DRVEN<1:8>, and pull-up-drives the second node (node A).

The first pull-up impedance unit 450A is enabled when the first inverting select signal DRVENB<1> is enabled in a low level and the enabled first pull-up impedance unit 450A determines the impedance value by the input pull-up impedance control code PCODE<N:0>. Meanwhile, when the first inverting select signal DRVENB<1> is disabled in a high level, the first pull-up impedance unit 450A is disabled. That is, when the first inverting select signal DRVENB<1> is enabled in a low level, a plurality of resistors within the first pull-up impedance unit 450A are turned on/off in response to the pull-up impedance control code PCODE<N:0> and when the first inverting select signal DRVENB<1> is disabled in a high level, all of the plurality of resistors in the first pull-up impedance unit 450A are turned off.

Further, similar to the first pull-up impedance unit 450A, the second to eighth dummy impedance units 450B, . . . , 450C are each enable when the inverting select signals DRVEN<2> to DRVEN<8> thereof are enabled in a low level and are each disabled when the inverting select signals DRVENB<2> to DRVENB<8> thereof are disabled in a high level.

The first to eighth pull-up impedance units 450A, 450B, . . . , 450C may be equally configured except for only the select signal DRVEN<8:1> corresponding thereto. In this case, the impedance values of the enabled pull-up impedance units may be equally determined by the pull-up impedance control code PCODE<N:0>.

The whole operation of the impedance control circuit 1100 illustrated in FIG. 6 is similar to the whole operation of the impedance control circuit 1000 illustrated in FIG. 4 and therefore, the difference therebetween will be mainly described.

When the calibration enable signal CAL_EN is enabled, the pull-down calibration operation is performed until the impedance value of the pull-down impedance unit 420 is first equal to that of the external resistance $R_{ZQ}$.

Further, the pull-down impedance control code NCODE<N:0> generated by the pull-down calibration operation is input to at least one dummy impedance unit 470A, 470B, . . . , 470C enabled in response to its own select signal DRVEN<1:8> to determine all the impedance values of the 8 dummy impedance units 470A, 470B, . . . , 470C. In this case, the first to eighth select signals DRVEN<1:8> are signals transferred from the impedance control circuit control unit 300 and the impedance control circuit control unit 300 enables at least one of the 8 select signals DRVEN<8:1> in response to the output control signal MRS<2:0>.

Thereafter, the pull-up calibration is performed so that the whole impedance value of the 8 pull-up impedance units 450A, 450B, ..., 450C is equal to the whole impedance value of the 8 dummy impedance units 470A, 470B, ..., 470C.

Figure 7A:
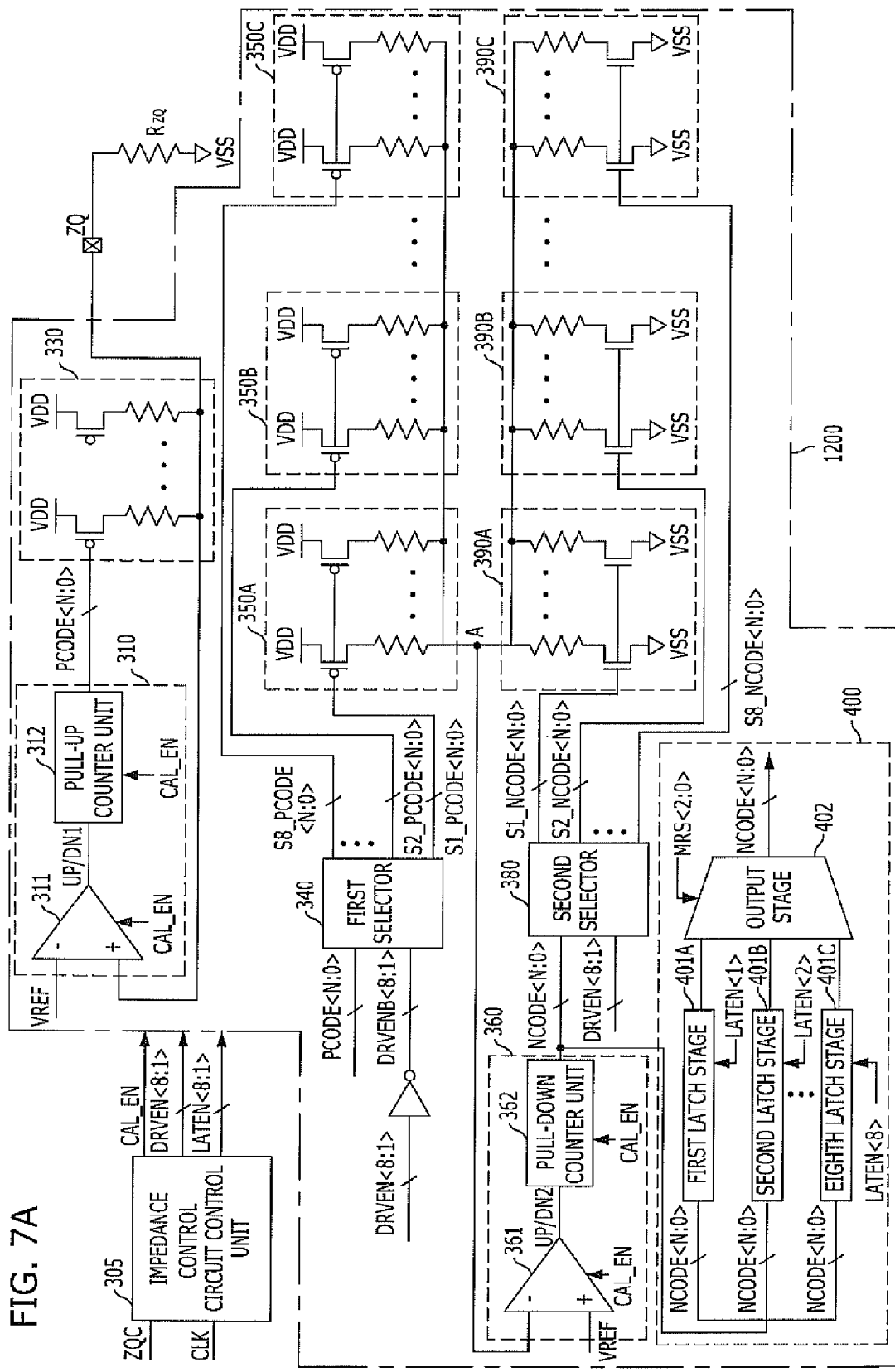
FIG. 7A is a diagram illustrating the impedance control circuit 1000 and an impedance control circuit control unit 305 in accordance with a third embodiment of the present invention.

FIG. 7A is a diagram illustrating the impedance control circuit 1200 and an impedance control circuit control unit 305 in accordance with a third embodiment of the present invention.

The impedance control circuit control unit 305 generates the calibration enable signal CAL_EN, M select signals DRVEN<M:1>, and M latch signals LATEN<M:1> and outputs these signals to the impedance control circuit 1200. Hereinafter, for description purposes, the case in which the impedance control circuit control unit 305 generates the 8 select signals DRVEN<8:1> and the 8 latch signals LATEN<M:1> will be described by way of example.

Figure 7B:
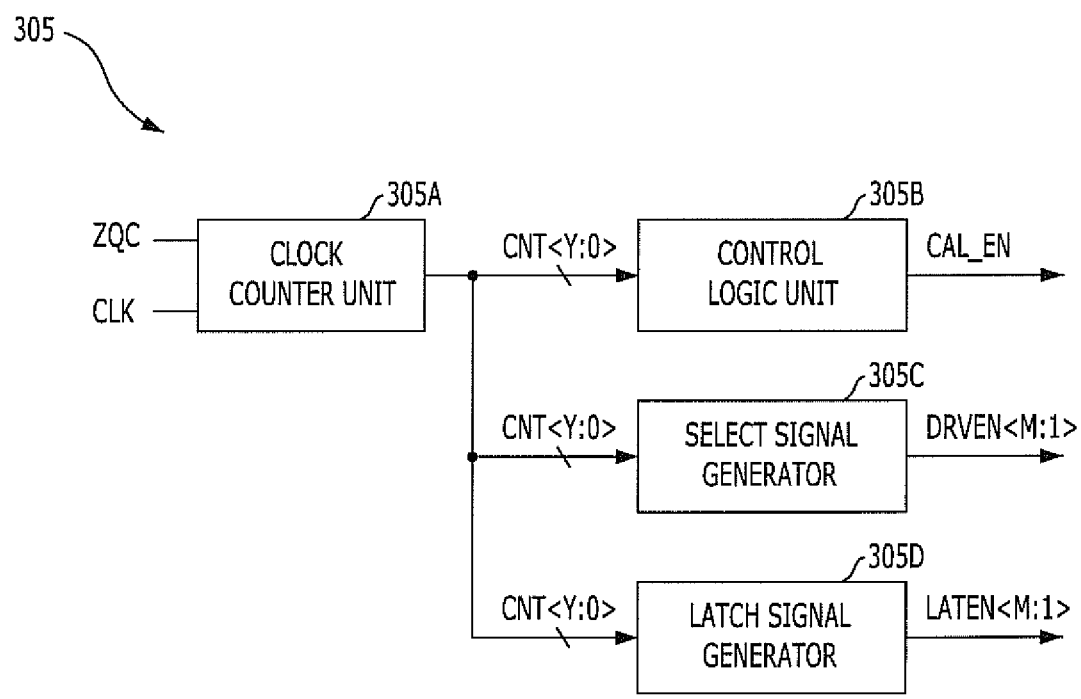
FIG. 7B is a diagram illustrating the embodiment of the control unit 305 in illustrated in FIG. 7A.

More specifically, the impedance control circuit control unit 305 may include a clock counter unit 305A, a control logic unit 305B, a select signal generator 305C, and a latch signal generator 305D as illustrated in FIG. 7B.

The clock counter unit 305A counts the clock CLK to output a counting code CNT<Y:0>. More specifically, the clock counter unit 305A increases its own value of the counting code CNT<Y:0> whenever the clock CLK is enabled and input from the instant that a calibration command ZQC is enabled and input. The control logic unit 305B enables the calibration enable signal CAL_EN and outputs the enabled calibration enable signal CAL_EN to the impedance control circuit 1200 until the value of the counting code CNT<Y:0> reaches a threshold value. In this case, the threshold value is changed depending on a type of a calibration operation. For example, the threshold value may be 64 in the case of a short calibration mode and may be 256 or 512 in the case of a long calibration mode.

The select signal generator 305C generates the 8 select signals DRVEN<8:1> using the counting code CNT<Y:0> and outputs the generated 8 select signals DRVEN<8:1> to the impedance control circuit 1200. Unlike the select signals DRVEN<8:1> illustrated in FIG. 4 (or FIG. 6), the first to eight select signals DRVEN<1:8> illustrated in FIG. 7A are sequentially enabled at a given interval for the whole calibration time (hereinafter, T0). The select signal DRVEN<8:1> will be described in detail with reference to FIGS. 8 and 10.

The latch signal generator 305D generates the 8 latch signals LATEN<8:1> using the counting code CNT<Y:0> and outputs the generated 8 latch signals LATEN<8:1> to the impedance control circuit 1200. The latch signal LATEN<8:1> will be described in detail with reference to FIGS. 9 and 10.

The impedance control circuit 1200 may further include a storage circuit 400 in addition to the components of the impedance control circuit 1000 illustrated in FIG. 4. That is, the impedance control circuit 1200 may include the pull-up code generator 310, the pull-up impedance unit 330, the M dummy impedance units 350A, 350B, ..., 350C, the pull-down code generator 360, the M pull-down impedance units 390A, 390B, ..., 390C, and the storage unit 400. Hereinafter, for description purposes, the case in which the impedance control circuit 1200 includes 8 dummy impedance units 350A, 350B, ..., 350C and 8 pull-down impedance units 390A, 390B, ..., 390C will be described by way of example.

The storage circuit 400 stores the pull-down impedance control codes NCODE<N:0> generated whenever the number of enabled pull-down impedance units is changed in response to their own select signals among the 8 pull-down impedance units 390A, 390B, ..., 390C and selectively outputs one of the stored pull-down impedance control codes NCODE<N:0> in response to the output control signal MRS<2:0>. More specifically, the storage circuit 400 may include 8 latch stages 401A, 401B, ..., 401C and an output unit 402 that selectively outputs one of the pull-down impedance control code NCODE<N:0> stored in the 8 latch stages 401A, 401B, ..., 401C in response to the output control signal MRS<0:2>. The 8 latch stages 401A, 401B, ..., 401C store the pull-down impedance control codes NCODE<N:0> generated whenever the number of enabled pull-down impedance units of the 8 pull-down impedance units 390A, 390B, ..., 390C is changed.

For example, when only the first pull-down impedance unit 390A of the 8 pull-down impedance units 390A, 390B, ..., 390C is enabled, the generated pull-down impedance control code NCODE<N:0> is stored in the first latch stage 401A in response to a first latch signal LATEN<1>. When the first and second pull-down impedance units 390A and 390B of the 8 pull-down impedance units 390A, 390B, ..., 390C are enabled, the generated pull-down impedance control code NCODE<N:0> is stored in the second latch stage 401B in response to a second latch signal LATEN<2>. Similarly, when all of the 8 pull-down impedance units 390A, 390B, ..., 390C are enabled, the generated pull-down impedance control code NCODE<N:0> is stored in the eighth latch stage 401C in response to an eighth latch signal LATEN<8>. Further, one of the 8 stored pull-down impedance control codes NCODE<N:0> is selectively output in response to the output control signal MRS<2:0>. Here, the output control signal may be the mode register set signal MRS<2:0>. For example, the storage circuit may be designed to output the pull-down impedance control code NCODE<N:0> stored in the first latch stage 401A when the output control signal MRS<2:0> is 000 and output the pull-down impedance control code NCODE<N:0> stored in the eighth latch stage 401C when the output control signal MRS<2:0> is 111.

Meanwhile, the storage circuit 400 may be designed to store the generated pull-down impedance control code NCODE<N:0> in first to M division calibration times (hereinafter, TD1 to TD8) that are obtained by dividing the whole calibration time into M and selectively output one pull-down impedance control code NCODE<N:0> of the stored pull-down impedance control codes in response to the output control signal MRS<2:0>. In detail, the storage circuit 400 may include the M latch stages 401A, 401B, ..., 401C and the output unit 402. Hereinafter, for description purposes, the case in which the storage circuit 400 includes the 8 latch stages 401A, 401B, ..., 401C will be described by way of example. Each of the first to eighth latch stages 401A, 401B, ..., 401C stores the generated pull-down impedance control code NCODE<N:0> in the first to eighth division calibration time TD1 to TD8 in response to each of the first to eighth latch signals LATEN<1:8>. The output unit 402 selectively outputs one pull-down impedance control code NCODE<N:0> of the pull-down impedance control codes stored in each of the first to eighth latch stages 401A, 401B, ..., 401C in response to the output control signal MRS<2:0>.

Figure 8:
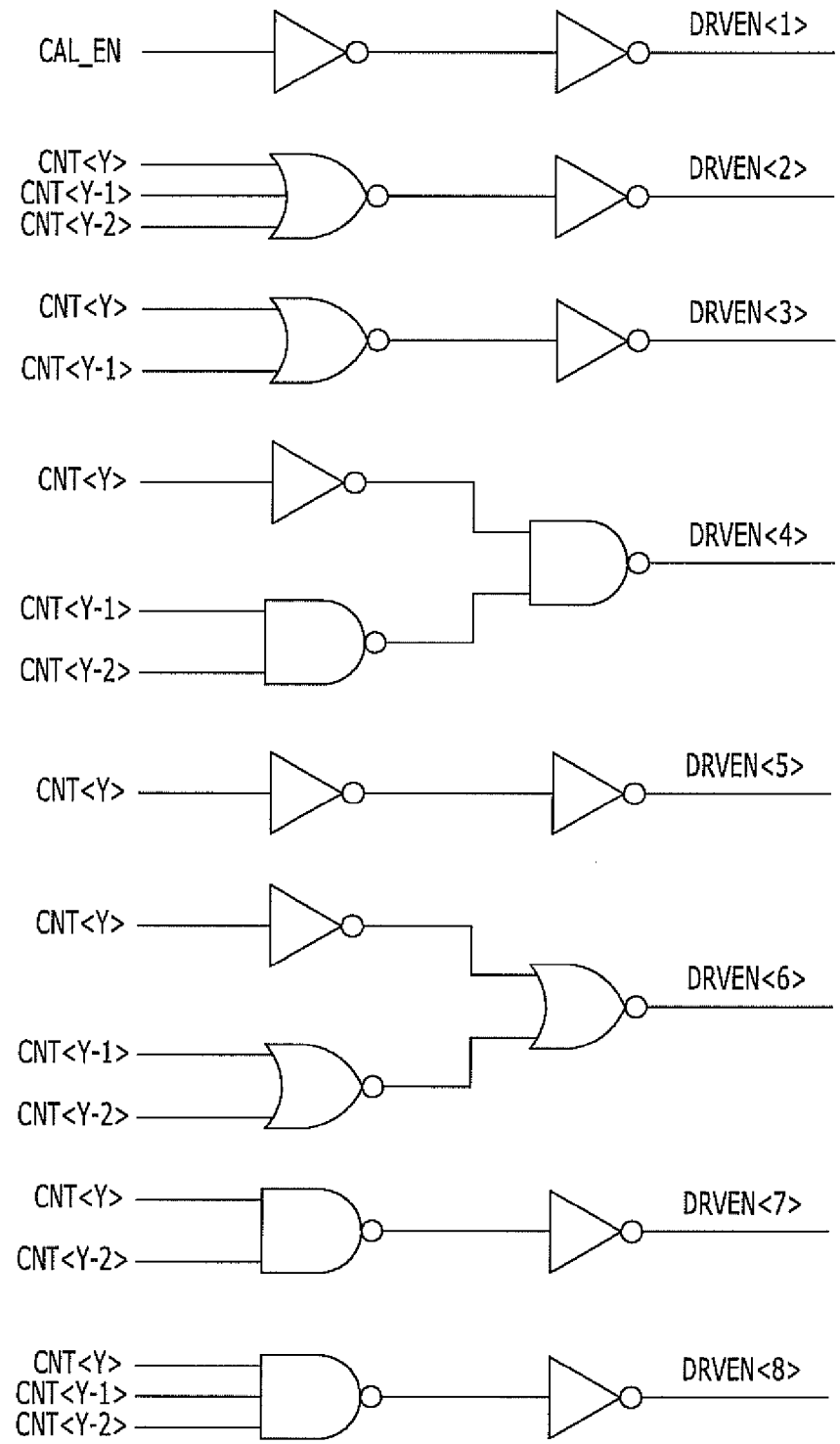
FIG. 8 is a diagram illustrating the embodiment of a select signal generator 305C illustrated in FIG. 7B.

FIG. 8 is a diagram illustrating the embodiment of a select signal generator 305C illustrated in FIG. 7B. For description purposes, FIG. 8 illustrates the case in which the 8 select signals DRVEN<8:1> are generated using the 3 upper bits CNT<Y:Y-2> of the counting codes CNT<Y:0>. The enable period of the 8 select signals DRVEN<8:1> is determined by the three upper bits CNT<Y:Y-2> of the counting code CNT<Y:0>. The enable period of the select signals DRVEN<8:1> will be described in detail with reference to FIG. 10.

Figure 9:
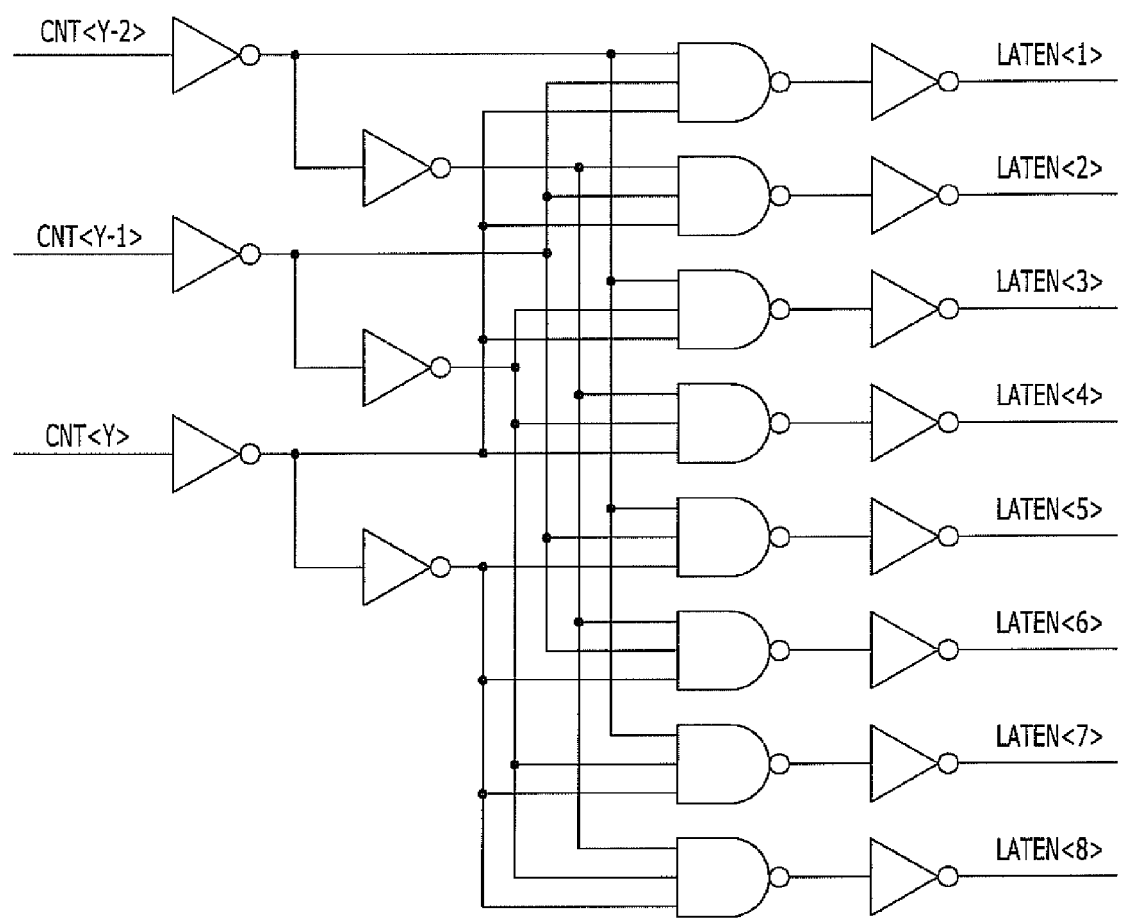
FIG. 9 is a diagram illustrating the embodiment of a latch signal generator 305D illustrated in FIG. 7B.

FIG. 9 is a diagram illustrating the embodiment of a latch signal generator 305D illustrated in FIG. 7B. For description purposes, FIG. 9 illustrates the case in which the 8 latch signals LATEN<8:1> are generated using the 3 upper bits CNT<Y:Y-2> of the counting codes CNT<Y:0>. The enable period of the 8 latch signals LATEN<8:1> is determined by the three upper bits CNT<Y:Y-2> of the counting code CNT<Y:0>. The enable period of the latch signals LATEN<8:1> will be described in detail with reference to FIG. 10.

Figure 10:
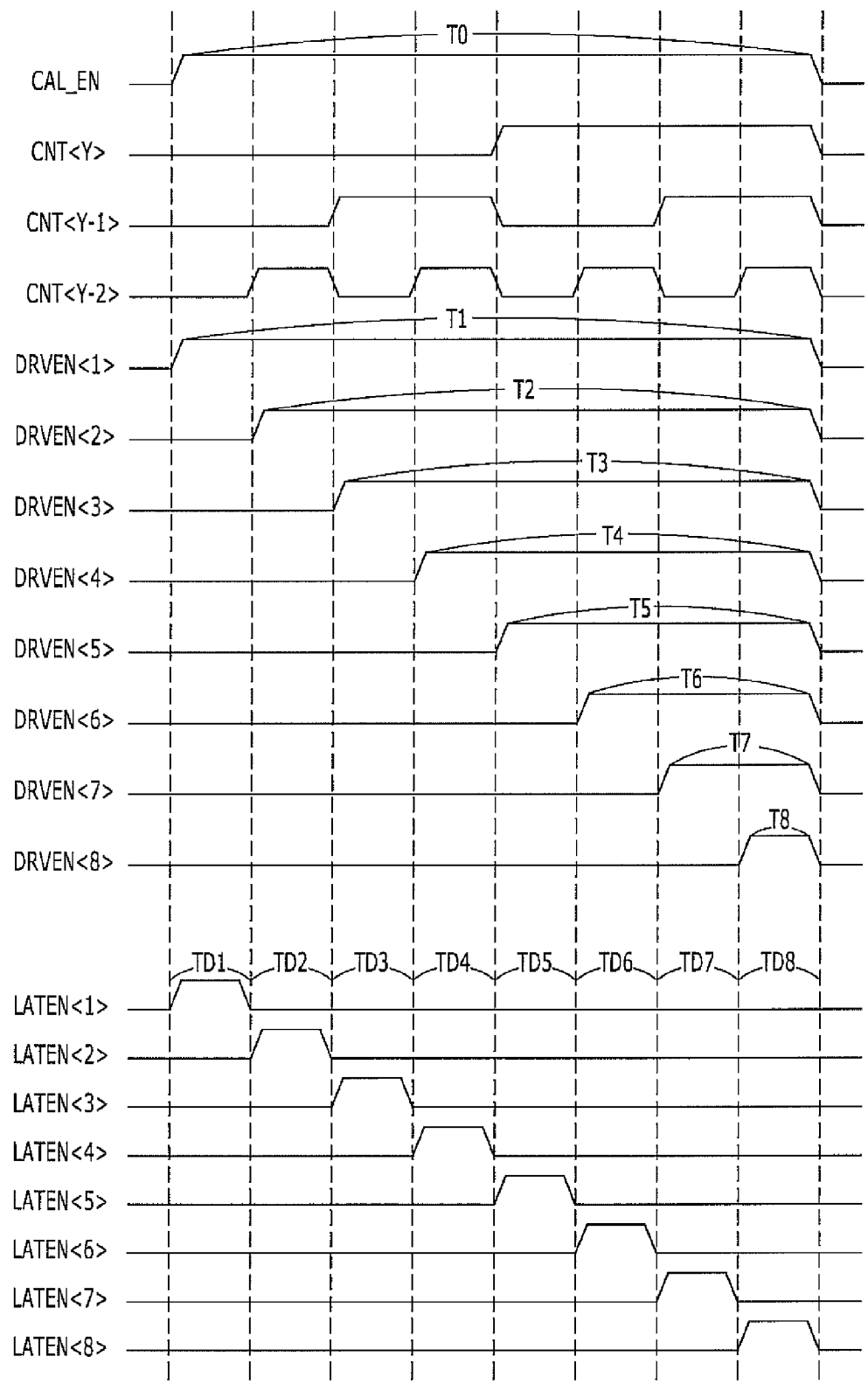
FIG. 10 is a timing diagram of a plurality of select signals DRVEN<8:1> and a plurality of latch signals LATEN<8:1> illustrated in FIG. 7A.

FIG. 10 is a timing diagram of the 8 select signals DRVEN<8:1> and the 8 latch signals LATEN<8:1> illustrated in FIG. 7A. Each of the first to eight division calibration times TD1 to TD8 is defined as T0/8 that is obtained by dividing the whole calibration time T0 into 8.

The first select signal DRVEN<1> may be enabled for the same period T1 as the whole calibration time T0. The second select signal DRVEN<2> is enabled until the whole calibration time T0 ends after the first division calibration time TD1 lapses. That is, the second select signal DRVEN<2> is enabled for period T2. A third select signal DRVEN<3> is enabled until the whole calibration time T0 ends after the second division calibration time TD2 lapses. That is, the third select signal DRVEN<3> is enabled for period T3. As a result, an A-th select signal DRVEN<A> (2≤A≤M) is enabled until the whole calibration time T0 ends after A-1-th division calibration time TD<A-1> lapses.

Meanwhile, the first latch signal LATEN<1> is enabled for the first division calibration time TIM and the second latch signal LATEN<2> is enabled for the second division calibration time TD2. That is, the A-th latch signal LATEN<A> is enabled for the A-th division calibration time TD<A>.

The overall operation of the impedance control circuit 1200 illustrated in FIG. 7A will be described with reference to FIG. 10.

When the calibration operation starts, the calibration enable signal CAL_EN is enabled. The pull-up comparator 311 compares the voltage of the first node (ZQ node) (the voltage generated by the voltage division of the external resistor $R_{ZQ}$ connected to the ZQ pad and the pull-up impedance unit 330) with the reference voltage VREF in response to the enabled calibration enable signal CAL_EN and generates the first up/down signal UP/DN1 depending on the comparison result. When the calibration enable signal CAL_EN is enabled, the pull-up counter unit 312 receives the first up/down signal UP/DN1 to generate the received pull-up impedance control code PCODE<N:0>. The pull-up impedance control code PCODE<N:0> turns-on/off the parallel resistors in the pull-up impedance unit 330 to control the impedance value of the pull-up impedance unit 330. The controlled impedance value of the pull-up impedance unit 330 again affects the voltage of the first node (ZQ node) and the above-mentioned operation is repeated. Consequently, the calibration operation is repeated (pull-up calibration) until the whole impedance value of the pull-up impedance unit 330 equal to the impedance value of the external resistor $R_{ZQ}$.

Since only the first select signal DRVEN<1> is enabled in a high level for the first division calibration time TD1, that is, only the first inverting select signal DRVENB<1> is enabled in a low level, only the first dummy impedance unit 350A is enabled and thus, the impedance values of the first dummy impedance unit 350A determined by the pull-up impedance control code PCODE<N:0> become the whole impedance values of the 8 dummy impedance units 350A, 350B, . . . , 350C.

Further, the pull-down calibration operation is performed. When the calibration enable signal CAL_EN is enabled, the pull-down comparator 361 compares the voltage of the second node (node A) with the reference voltage VREF and generates the second dup/down signal UP/DN2 depending on the comparison result. When the calibration enable signal CAL_EN is enabled, the pull-down counter unit 362 receives the second up/down signal UP/DN1 to generate the pull-down impedance control code NCODE<N:0>. Since only the first select signal DRVEN<1> is enabled in a high level for the first division calibration time TD1, only the first pull-down impedance unit 390A of the 8 pull-down impedance units 390A, 390B, . . . , 390C is enabled. The pull-down impedance control code NCODE<N:0> turns-on/off the parallel resistors in the first pull-down impedance unit 390A to control the impedance value of the first pull-down impedance unit 390A. As a result, the impedance values of the first pull-down impedance unit 390A become the whole impedance values of the 8 pull-down impedance units 390A, 390B, . . . , 390C. The controlled impedance value of the first pull-up impedance unit 390A again affects the voltage of the second node (ZQ node) and the above-mentioned operation is repeated. Consequently, the calibration is performed so that the impedance value of the first pull-down impedance unit 390A is equal to the impedance value of the first dummy impedance unit 350A (pull-down calibration).

Further, when only the first pull-down impedance unit 390A is enabled, the pull-down impedance control code NCODE<N:0> is stored in the first latch stage 401A in the storage circuit 400 in response to the first latch signal LATEN<1>.

Only the first and second inverting select signals DRVENB<1:2> of the 8 inverting select signals DRVENB<8:1> are enabled in a low level for the second division calibration time TD2, such that the first and second dummy impedance units 350A and 350B of the 8 dummy impedance units 350A, 350B, . . . , 350C are enabled. The impedance values of the first and second dummy impedance units 350A and 350B are determined by the pull-up impedance control code PCODE<N:0>. As a result, the sum of the impedance values of the first and second dummy impedance units 350A and 350B connected to the second node (node A) in parallel becomes the whole impedance value of the 8 dummy impedance units 350A, 390B, . . . , 390C. The pull-down calibration operation is again performed. Only the first and second select signals DRVEN<2:1> of the 8 select signals DRVEN<8:1> are enabled in a high level for the second division calibration time TD2, such that only the first and second pull-down impedance units 390A and 390B of the 8 pull-down impedance units 390A, 390B, . . . , 350C are enabled. Therefore, the sum of the impedance values of the first and second pull-down impedance units 390A and 390B connected to the second node (node A) in parallel becomes the whole impedance value of the 8 pull-down impedance units 390A, 390B, . . . , 390C. As a result, the calibration is performed so that the sum of the impedance values of the first and second pull-down impedance units 390A and 390B connected with the second node (node A) in parallel is equal to the sum of the impedance values of the first and second dummy impedance units 350A and 350B.

Further, when only the first and second pull-down impedance units 390A and 390B are enabled, the pull-down impedance control code NCODE<N:0> is stored in the second latch stage 401B in the storage circuit 400 in response to the second latch signal LATEN<2>.

The aforementioned operation is repeated until all of the 8 pull-down impedance units 390A, 390B, . . . , 390C are enabled. Further, when all of the 8 pull-down impedance units 390A, 390B, . . . , 390C are enabled, the pull-down impedance control code NCODE<N:0> is stored in the eighth latch stage 401C in the storage circuit 400 in response to the eighth latch signal LATEN<8>.

Further, the output unit 402 in the storage circuit 400 selectively outputs one pull-down impedance control code NCODE<N:0> of the pull-down impedance control codes NCODE<N 0> stored in the 8 latch stages 401A, 401B, ..., 401C in response to the output control signal MRS<2:0>. For example, the output unit 402 may be designed to output the pull-down impedance control code NCODE<N:0> stored in the second latch stage 401B when the output control signal MRS<2:0> is 001 and output the pull-down impedance control code NCODE<N:0> stored in the eighth latch stage 401C when the output control signal MRS<2:0> is 111.

Meanwhile, each division calibration time TD1 to TD8 may be adjusted. For example, the first division calibration time TD1 for enabling only the first pull-down impedance unit 390A of the 8 pull-down impedance units 390A, 390B, ..., 390C may be set to be relatively longer than other division calibration times TD2 to TD8.

Meanwhile, the impedance control circuit in accordance with the embodiment of the present invention may be designed to further include the storage circuit 400 illustrated in FIG. 7A in addition to the components of the impedance control circuit 1100 illustrated in FIG. 6. In this case, the storage circuit 400 may be designed to store the pull-up impedance control codes PCODE<N:0> generated whenever the number of enabled pull-up impedance units is changed in response to their own select signals among the 8 pull-up impedance units 450A, 450B, ..., 450C and selectively output one of the stored 8 pull-up impedance control codes PCODE<N:0> in response to the output control signal MRS<2:0>.

Figure 11:
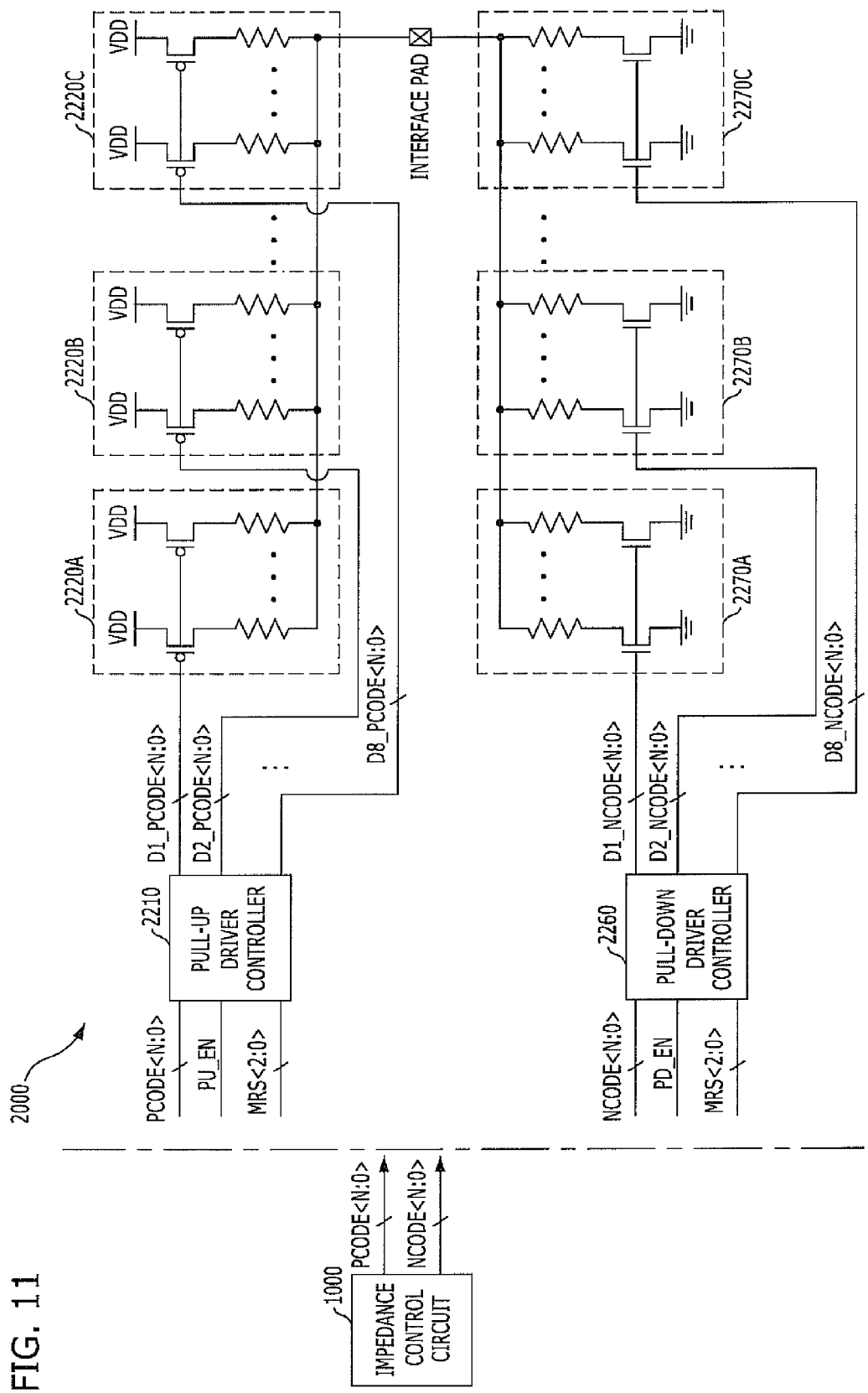
FIG. 11 is a diagram illustrating a semiconductor device in accordance with an embodiment of the present invention.

FIG. 11 is a diagram illustrating a semiconductor device in accordance with an embodiment of the present invention.

The semiconductor device may include the impedance control circuit 1000 and a termination circuit 2000.

The impedance control circuit 1000 generates the pull-up impedance code PCODE<N:0> and the pull-down impedance code NCODE<N:0> for controlling a termination impedance value and outputs the generated pull-up impedance code PCODE<N:0> and pull-down impedance code NCODE<N:0> to the termination circuit 2000. The impedance control circuit 1000 may be designed to have the same configuration as the impedance control circuit illustrated FIG. 4, 6, or 7A.

The termination circuit 2000 terminates an interface pad with the impedance values defined by the pull-up impedance code PCODE<N:0> and the pull down impedance code NCODE<N:0> that are output from the impedance control circuit 1000. More specifically, the termination circuit 2000 may include M pull-up termination units 2220A, 2220B, ..., 2220C and M pull-down termination units 2270A, 2270B, ..., 2270C. Hereinafter, for description purposes, the case in which the termination circuit 2000 includes 8 pull-up termination units 2220A, 2220B, ..., 2220C and the 8 pull-down termination units 2270A, 2270B, ..., 2270C will be described by way of example.

The first to eighth pull-up termination units 2220A, 2220B, ..., 2220C may be designed to be similar to the first to eighth dummy termination units 350A, 350B, ..., 350C illustrated in FIG. 4 or 7A. In addition, the first to eighth pull-up termination units 2220A, 2220B, ..., 2220C may be designed to be similar to the first to eighth pull-up termination units 450A, 450B, ..., 450C illustrated in FIG. 6.

The pull-up driver controller 2210 controls each of the 8 pull-up termination units 2220A, 2220B, ..., 2220C in response to the pull-up impedance control code PCODE<N:0> and the pull-up enable signal PU_EN. In this case, the pull-up enable signal PU_EN is a signal that enables/disables each of the 8 pull-up termination units 2220A, 2220B, ..., 2220C. For example, when the pull-up enable signal PU_EN is enabled, the resistors within the first pull-up termination unit 2220A are turned on/off in response to the pull-up impedance control code PCODE<N:0>. On the other hand, when the pull-up enable signal PU_EN is disabled, the first pull-up termination unit 2220A are not operated regardless of the pull-up impedance control code PCODE<N:0>. That is, all of the resistors within the first pull-up termination unit 2220A are turned off. The pull-up driver controller 2210 may control the second to eighth pull-up termination units 2220B, ..., 2220C the same as the first pull-up termination unit 2220A.

Meanwhile, the pull-up driver controller 2210 enables at least one of the 8 pull-up termination units 2220A, 2220B, ..., 2220C in response to the output control signal MRS<2:0>. Here, the output control signal may be the mode register set signal MRS<2:0>. That is, the pull-up driver controller 2210 enables at least one of the 8 pull-up termination units 2220A, 2220B, ..., 2220C in response to the output control signal MRS<2:0>, wherein the resistors in the enabled pull-up termination unit are turned on/off in response to the pull-up impedance control code PCODE<N:0> and all of the resistors in the disabled remaining pull-up termination units are turned off.

The first to eighth pull-down termination units 2270A, 2270B, ..., 2270C may be designed to be similar to the first to eighth pull-down termination units 390A, 390B, ..., 390C illustrated in FIG. 4 or 7A. In addition, the first to eighth pull-down termination units 2270A, 2270B, ..., 2270C may be designed to be similar to the first to eighth dummy termination units 470A, 470B, ..., 470C illustrated in FIG. 6.

The pull-down driver controller 2260 controls each of the 8 pull-down termination units 2270A, 2270B, ..., 2270C in response to the pull-down impedance control code NCODE<N:0> and the pull-down enable signal PD_EN. The pull-down enable signal PD_EN is a signal that enables/disables each of the 8 pull-down termination units 2270A, 2270B, ..., 2270C. For example, when the pull-down enable signal PD_EN is enabled, the resistors within the first pull-down termination unit 2270A are turned on/off in response to the pull-down impedance control code NCODE<N:0>. On the other hand, when the pull-down enable signal PD_EN is disabled, the first pull-down termination unit 2270A are not operated regardless of the pull-down impedance control code NCODE<N:0>. That is, all of the resistors within the first pull-down termination unit 2270A are turned off.

Meanwhile, the pull-down driver controller 2260 enables at least one of the 8 pull-down termination units 2270A, 2270B, ..., 2270C in response to the output control signal MRS<2:0>. That is, the pull-down driver controller 2260 enables at least one of the 8 pull-down termination units 2270A, 2270B, ..., 2270C in response to the output control signal MRS<2:0>, wherein the resistors in the enabled pull-down termination unit are turned on/off in response to the pull-down impedance control code NCODE<N:0> and all of the resistors in the disabled remaining pull-down termination units are turned off.

Meanwhile, the termination circuit may also be a main deriver of an output driver that outputs data. When the pull-up enable signal PU_EN is enabled, the 8 pull-up termination units 2220A, 2220B, ..., 2220C set the interface pad (in this case, DQ PAD) to be in a high level, such that high data are output through the interface pad. In addition, when the pull-down enable signal PD_EN is enabled, the 8 pull-down termination units 2270A, 2270B, ..., 2270C set the interface pad to be in a low level, such that low data are output through the interface pad.

Meanwhile, FIG. 11 illustrates the case in which the termination circuit 2000 includes the M pull-up termination units 2220A, 2220B, ..., 2220C and the M pull-down termination units 2270A, 2270B, ..., 2270C, but the termination circuit 2000 may include only the M pull-up termination units 2220A, 2220B, ..., 2220C or only the M pull-down termination units 2270A, 2270B, ..., 2270C, depending on the termination scheme.

Figure 12:
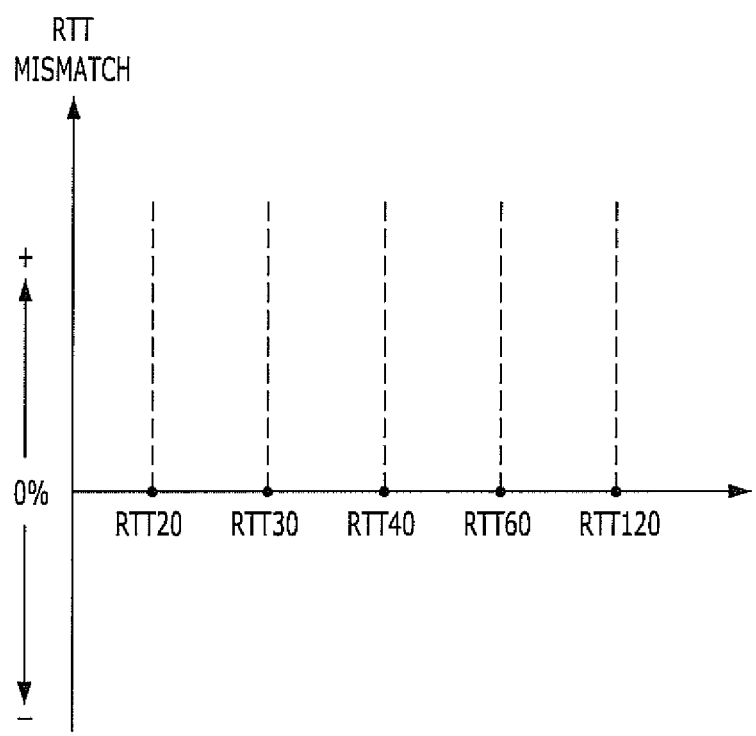
FIG. 12 is a diagram illustrating RTT MISMATCH depending on a targeted impedance value in the semiconductor device in accordance with the embodiment of the present invention.

FIG. 12 is a diagram illustrating RTT MISMATCH depending on the targeted impedance value in the semiconductor device in accordance with the embodiment of the present invention.

The impedance control circuit 1000 is designed so as to be similar to the layout of the termination circuit 2000, that is, the impedance control circuit 1000 is designed to include the M pull-down impedance units as illustrated in FIG. 4 or 7A or the M pull-up impedance unit as illustrated in FIG. 6, such that the RTT MISMATCH due to the parasitic component occurring in the layout of the termination circuit 2000 may be reduced. That is, when the impedance control circuit 1000 generates the impedance control codes PCODE<N:0> and NCODE<N:0>, the impedance control codes PCODE<N:0> and NCODE<N:0> are generated by considering the impedance mismatch factors such as the parasitic resistance component occurring in the layout, the voltage drop due to the parasitic resistance component changed depending on the number of enabled termination units, or the like. Therefore, the termination circuit 2000 uses impedance control codes PCODE<N:0> and NCODE<N:0> generated in consideration of all the impedance mismatch factors, thereby reducing the RTT MISMATCH.

The exemplary embodiments of the present invention may reduce the impedance mismatch between the pull-up termination unit and the pull-down termination unit that occurs due to the parasitic resistance. Therefore, the accuracy of the impedance matching may be improved at the time of the termination operation.

While the present invention has been described with respect to the specific embodiments, it will be apparent to those skilled in the art that various changes and modifications may be made without departing from the spirit and scope of the invention as defined in the following claims.

What is claimed is:

1. An impedance control circuit, comprising:
   a pull-up code generator configured to generate pull-up impedance control codes using a voltage of a first node;
   a pull-up impedance unit configured to pull-up-drive the first node in response to the pull-up impedance control codes;
   a plurality of dummy impedance units enabled in response to respective select signals and each configured to pull-up-drive a second node in response to the pull-up impedance control codes;
   a pull-down code generator configured to generate pull-down impedance control codes using a voltage of the second node; and
   a plurality of pull-down impedance units enabled in response to the respective select signals and each configured to pull-down-drive the second node in response to the pull-down impedance control codes.

2. The impedance control circuit of claim 1, wherein enabled dummy impedance units among the dummy impedance units have the same impedance value determined by the pull-up impedance control codes, and enabled pull-down impedance units among the pull-down impedance units have the same impedance value determined by the pull-down impedance control codes.

3. The impedance control circuit of claim 1, wherein at least one of the select signals is enabled in response to an output control signal.

4. The impedance control circuit of claim 3, further comprising a storage circuit configured to store the pull-down impedance control codes generated whenever the number of enabled pull-down impedance units is changed among the pull-down impedance units and selectively output one of the stored pull-down impedance control codes is in response to the output control signal.

5. The impedance control circuit of claim 3, further comprising a storage circuit configured to store the pull-down impedance control codes generated for each of division calibration times that are obtained by dividing a whole calibration time into the number of the pull-down impedance units and selectively output one of the stored pull-down impedance control codes in response to the output control signal,
   wherein an enable period of an A-th select signal (2≤A≤ the number of the pull-down impedance units) is from an end of an A-1-th division calibration time to an end of the whole calibration time.

6. The impedance control circuit of claim 5, wherein the storage circuit includes:
   a plurality of latch stages configured to store the pull-down impedance control codes generated for the respective division calibration times in response to a plurality of latch signals, respectively; and
   an output unit configured to selectively output one of the pull-down impedance control codes stored in the latch stages in response to the output control signal.

7. The impedance control circuit of claim 3, wherein the output control signal includes a mode register set signal.

8. The impedance control circuit of claim 1, wherein the pull-up code generator includes:
   a pull-up comparator configured to compare a reference voltage with the voltage of the first node to generate a first up/down signal indicating which voltage is higher; and a pull-up counter unit configured to increase/reduce the values of the pull-up impedance control codes in response to the first up/down signal, and
   the pull-down code generator includes:
   a pull-down comparator configured to compare the reference voltage with the voltage of the second node to generate a second up/down signal indicating which voltage is higher; and a pull-down counter unit configured to increase/reduce the values of the pull-down impedance control codes in response to the second up/down signal.

9. The impedance control circuit of claim 1, wherein each of the dummy impedance units includes a plurality of resistors that is connected to the second node in parallel and configured to supply a power supply voltage to the second node therethrough in response to the pull-up impedance control codes, and
   each of the pull-down impedance units includes a plurality of resistors that is connected to the second node in parallel and configured to supply a ground voltage to the second node therethrough in response to the pull-down impedance control codes.

10. The impedance control circuit of claim 1, further comprising:
    a first selector configured to transmit the pull-up impedance control codes to the plurality of dummy impedance units in response to the respective select signals; and a second selector configured to transmit the pull-down impedance control codes to the plurality of pull-down impedance units in response to the respective select signals.

11. An impedance control circuit, comprising:
a pull-down code generator configured to generate pull-down impedance control codes using a voltage of a first node;
a pull-down impedance unit configured to pull-down-drive the first node in response to the pull-down impedance control codes;
a plurality of dummy impedance units enabled in response to respective select signals and each configured to pull-down-drive a second node in response to the pull-down impedance control codes;
a pull-up code generator configured to generate pull-up impedance control codes using a voltage of the second node; and
a plurality of pull-up impedance units enabled in response to the respective select signals and each configured to pull-up-drive the second node in response to the pull-up impedance control codes.

12. The impedance control circuit of claim 11, wherein enabled dummy impedance units among the dummy impedance units have the same impedance value determined by the pull-down impedance control codes, and enabled pull-up impedance units among the pull-up impedance units have the same impedance value determined by the pull-up impedance control codes.

13. The impedance control circuit of claim 11, wherein at least one of the select signals is enabled in response to an output control signal.

14. The impedance control circuit of claim 13, further comprising a storage circuit configured to store the pull-up impedance control codes generated whenever the number of enabled pull-up impedance units is changed among the pull-up impedance units and selectively output one of the stored pull-up impedance control codes is in response to the output control signal.

15. The impedance control circuit of claim 13, further comprising a storage circuit configured to store the pull-up impedance control codes generated for each of division calibration times that are obtained by dividing a whole calibration time into the number of the pull-up impedance units and selectively output one of the stored pull-up impedance control codes in response to the output control signal,
wherein an enable period of an A-th select signal ($2 \leq A \leq$ the number of the pull-up impedance units) is from an end of an A-1-th division calibration time to an end of the whole calibration time.

16. The impedance control circuit of claim 15, wherein the storage circuit includes:
a plurality of latch stages configured to store the pull-up impedance control codes generated for the respective division calibration times in response to a plurality of latch signals, respectively; and
an output unit configured to selectively output one of the pull-up impedance control codes stored in the latch stages in response to the output control signal.

17. A semiconductor device, comprising:
an impedance control circuit configured to generate pull-up impedance control codes and pull-down impedance control codes using a voltage of a first node; and
a termination circuit configured to control impedance values of an interface pad in response to the pull-up impedance control codes and the pull-down impedance control codes,
wherein the impedance control circuit includes:
a plurality of dummy impedance units enabled in response to respective select signals.

18. The semiconductor device of claim 17, wherein the impedance control circuit further includes:
a pull-up code generator configured to generate the pull-up impedance control codes using the voltage of the first node;
a pull-up impedance unit configured to pull-up-drive the first node with an impedance value determined in response to the pull-up impedance control codes;
a pull-down code generator configured to generate the pull-down impedance control codes using a voltage of the second node; and
a plurality of pull-down impedance units enabled in response to the respective select signals, wherein the enabled pull-down impedance units are configured to pull-down-drive the second node with the same impedance value determined in response to the pull-down impedance control codes,
wherein the plurality of dummy impedance units are configured to pull-up-drive a second node with the same impedance value determined in response to the pull-up impedance control codes.

19. The semiconductor device of claim 18, wherein at least one of the select signals is enabled in response to an output control signal.

20. The semiconductor device of claim 19, wherein the impedance control circuit further includes a storage circuit configured to store the pull-down impedance control codes generated whenever the number of the enabled pull-down impedance units is changed and selectively output one of the stored pull-down impedance control codes is in response to the output control signal.

21. The semiconductor device of claim 19, wherein the impedance control circuit further includes a storage circuit configured to store the pull-down impedance control codes generated for each of division calibration times that are obtained by dividing a whole calibration time into the number of the pull-down impedance units and selectively output one of the stored pull-down impedance control codes in response to the output control signal,
wherein an enable period of an A-th select signal ($2 \leq A \leq$ the number of the pull-down impedance units) is from an end of an A-1-th division calibration time to an end of the whole calibration time.

22. The semiconductor device of claim 21, wherein the storage circuit includes:
a plurality of latch stages configured to store the pull-down impedance control codes generated for the respective division calibration times in response to a plurality of latch signals, respectively; and
an output unit configured to selectively output one of the pull-down impedance control codes stored in the latch stages in response to the output control signal to the termination circuit.

23. The semiconductor device of claim 17, wherein the impedance control circuit includes:
a pull-down code generator configured to generate the pull-down impedance control codes using the voltage of the first node;
a pull-down impedance unit configured to pull-down-drive the first node with an impedance value determined in response to the pull-down impedance control codes;
a plurality of dummy impedance units enabled in response to respective select signals, wherein the enabled dummy impedance units are configured to pull-down-drive a second node with the same impedance value determined in response to the pull-down impedance control codes;

a pull-up code generator configured to generate the pull-up impedance control codes using a voltage of the second node; and a plurality of pull-up impedance units enabled in response to the respective select signals, wherein the enabled pull-up impedance units are configured to pull-up-drive the second node with the same impedance value determined in response to the pull-up impedance control codes.

24. The semiconductor device of claim 17, wherein the first node includes a ZQ node to which an external resistor is connected.

* * * * *